United States Patent
Kim et al.

(10) Patent No.: US 11,189,491 B2
(45) Date of Patent: Nov. 30, 2021

(54) METHOD OF FORMING MASK PATTERN AND METHOD OF FABRICATING SEMICONDUCTOR DEVICE USING THE SAME

(71) Applicant: SAMSUNG ELECTRONICS CO., LTD., Suwon-si (KR)

(72) Inventors: Chul-Ho Kim, Seoul (KR); Yool Kang, Yongin-si (KR); Jaesung Kang, Suwon-si (KR); Jinphil Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 16/733,447

(22) Filed: Jan. 3, 2020

(65) Prior Publication Data
US 2020/0234947 A1  Jul. 23, 2020

(30) Foreign Application Priority Data

Jan. 22, 2019  (KR) .................. 10-2019-0008116

(51) Int. Cl.
| | | |
|---|---|---|
| *H01L 21/027* | (2006.01) | |
| *H01L 21/02* | (2006.01) | |
| *H01L 21/311* | (2006.01) | |
| *H01L 21/768* | (2006.01) | |

(52) U.S. Cl.
CPC .... *H01L 21/0274* (2013.01); *H01L 21/02282* (2013.01); *H01L 21/31144* (2013.01); *H01L 21/76808* (2013.01)

(58) Field of Classification Search
None
See application file for complete search history.

(56) References Cited

U.S. PATENT DOCUMENTS

| | | | |
|---|---|---|---|
| 7,247,555 B2 * | 7/2007 | Cong | ................ H01L 21/76808 257/E21.257 |
| 8,148,784 B2 | 4/2012 | Lee | |
| 8,822,124 B2 | 9/2014 | Trefonas et al. | |
| 9,499,698 B2 | 11/2016 | Yao et al. | |
| 9,837,273 B2 | 12/2017 | Lee et al. | |
| 9,929,013 B2 | 3/2018 | Kim et al. | |
| 2003/0098484 A1 * | 5/2003 | Kim | ........................ H01L 28/60 257/307 |
| 2005/0106886 A1 * | 5/2005 | Goodner | ........... H01L 21/76808 438/706 |

(Continued)

FOREIGN PATENT DOCUMENTS

| | | |
|---|---|---|
| JP | 2004-241586 A | 8/2004 |
| JP | 4883286 B2 | 2/2012 |

(Continued)

*Primary Examiner* — Evren Seven
(74) *Attorney, Agent, or Firm* — Lee IP Law, P.C.

(57) ABSTRACT

A method of forming a mask pattern and a method of fabricating a semiconductor device, the method of forming a mask pattern including providing a substrate including a plurality of patterns thereon; forming a mask material solution layer such that the mask material solution layer covers the patterns on the substrate; and applying a liquid material to remove an upper portion of the mask material solution layer, wherein the mask material solution layer includes a fluorine additive concentrated at the upper portion of the mask material solution layer.

20 Claims, 28 Drawing Sheets

(56) References Cited

U.S. PATENT DOCUMENTS

| | | | |
|---|---|---|---|
| 2005/0153566 A1* | 7/2005 | Han | H01L 21/76808 438/725 |
| 2005/0164494 A1* | 7/2005 | Nakagawa | B82Y 10/00 438/637 |
| 2009/0117745 A1* | 5/2009 | Li | H01L 21/76807 438/710 |
| 2010/0279510 A1* | 11/2010 | Nozawa | H01L 21/02307 438/710 |
| 2015/0145068 A1 | 5/2015 | Chen et al. | |
| 2016/0064274 A1* | 3/2016 | Peng | H01L 21/76816 257/774 |
| 2016/0111374 A1* | 4/2016 | Brink | H01L 21/31144 257/774 |
| 2016/0149016 A1* | 5/2016 | Farmer | H01L 29/78 257/401 |
| 2018/0076127 A1 | 3/2018 | Baek et al. | |

FOREIGN PATENT DOCUMENTS

| | | |
|---|---|---|
| KR | 10-2009-0025438 A | 3/2009 |
| KR | 10-2018-0083852 A | 7/2018 |

* cited by examiner

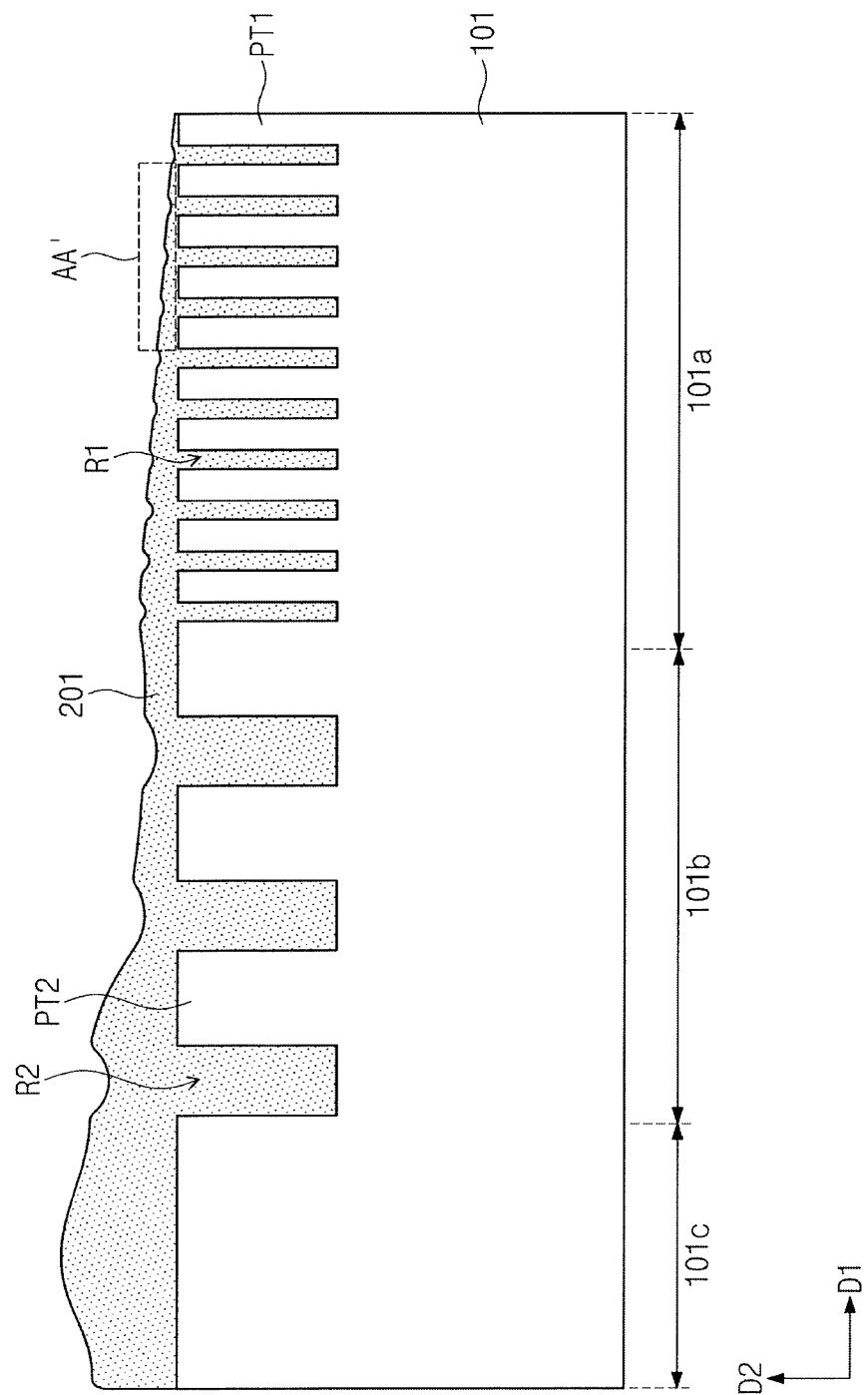

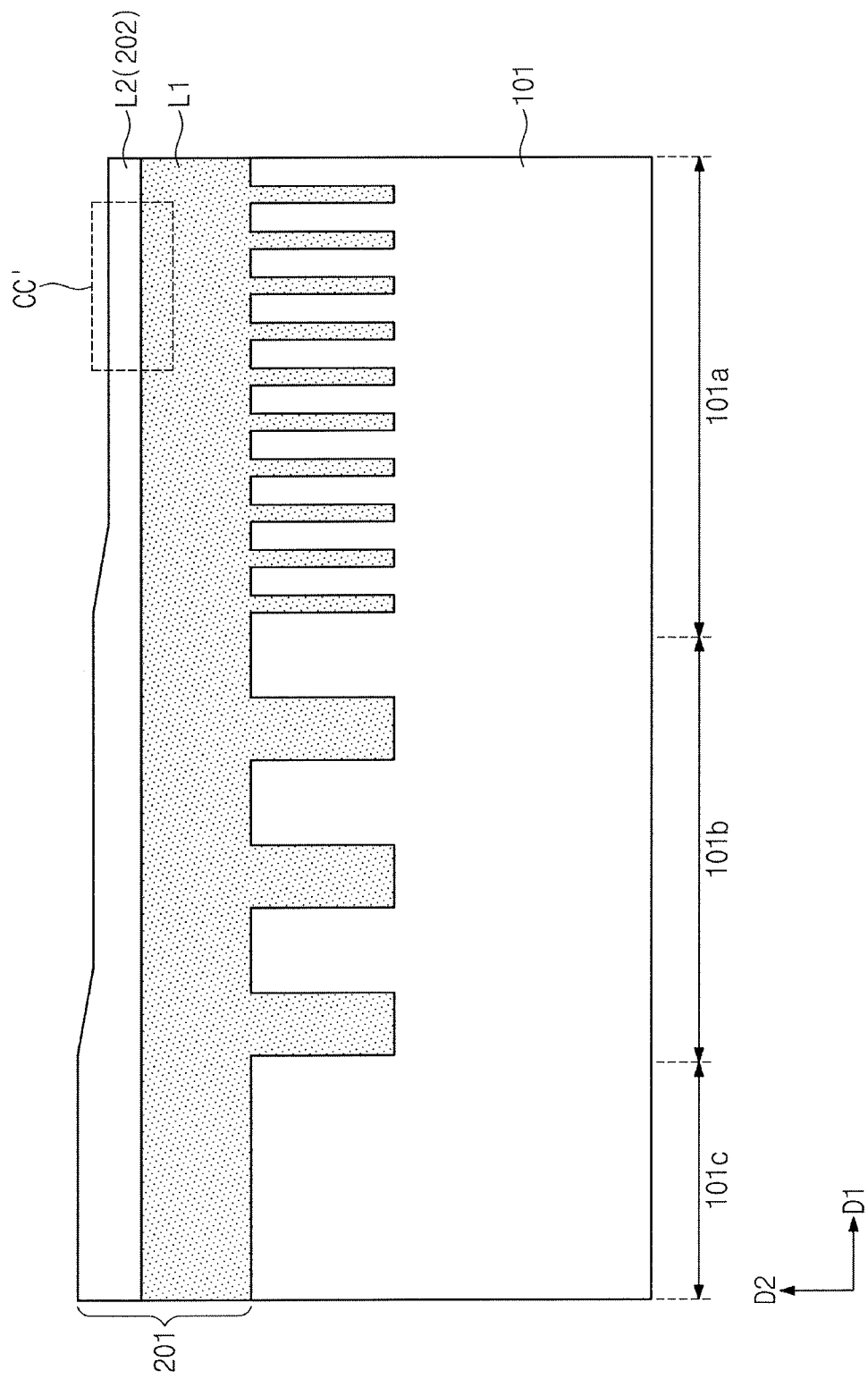

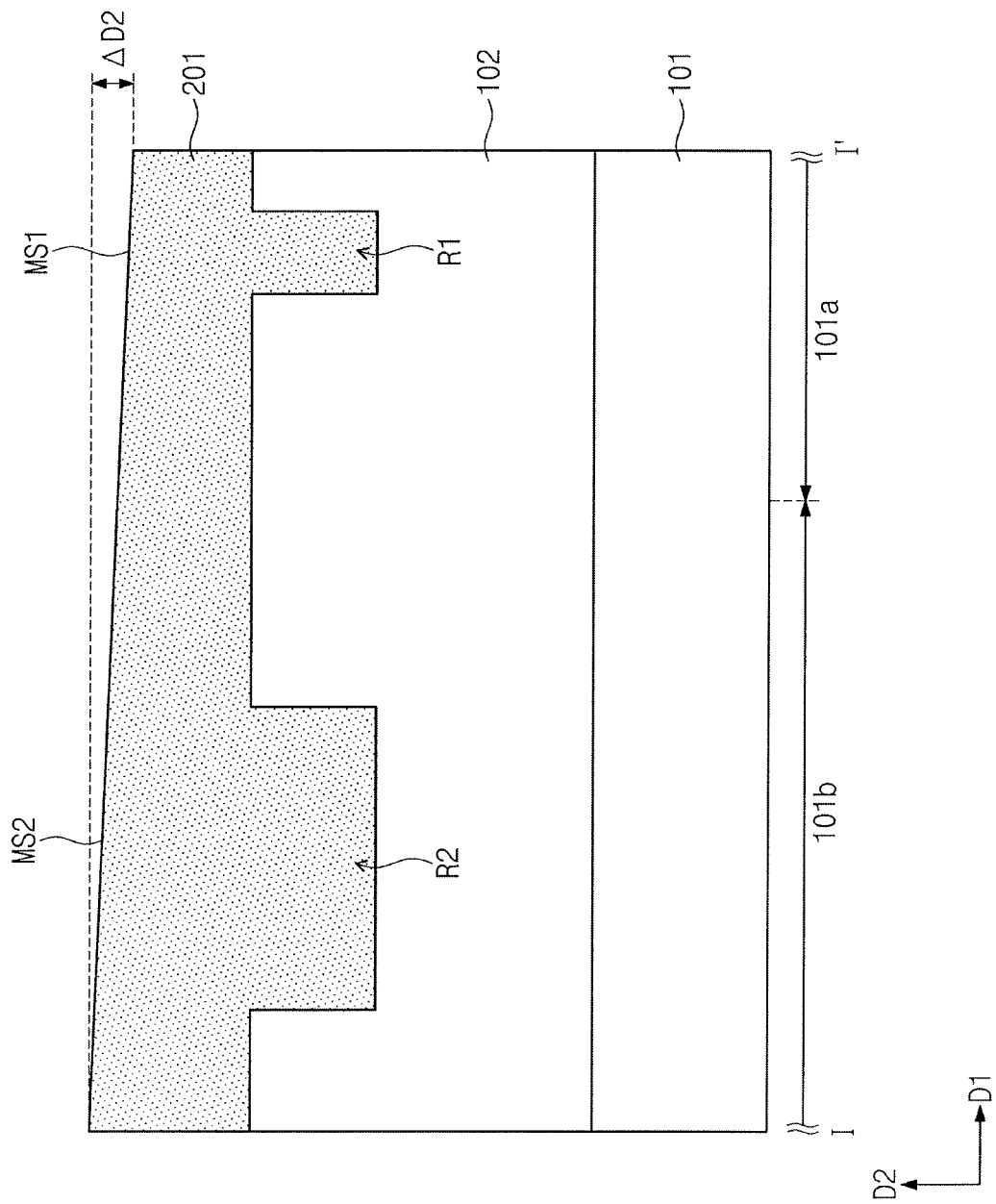

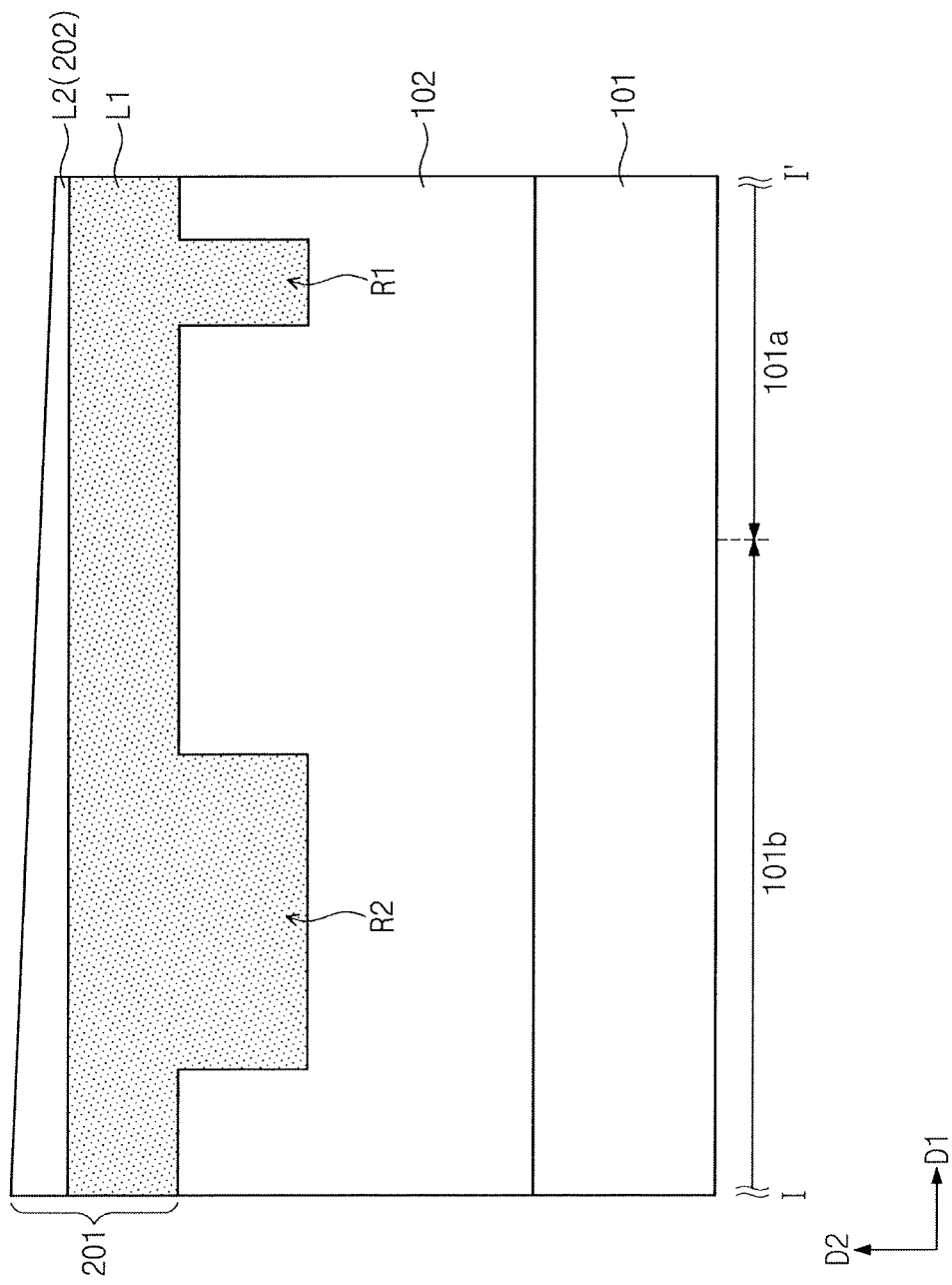

METHOD OF FORMING MASK PATTERN AND METHOD OF FABRICATING SEMICONDUCTOR DEVICE USING THE SAME

CROSS-REFERENCE TO RELATED APPLICATION

Korean Patent Application No. 10-2019-0008116 filed on Jan. 22, 2019 in the Korean Intellectual Property Office, and entitled: "Method of Forming Mask Pattern and Method of Fabricating Semiconductor Device Using the Same," is incorporated by reference herein in its entirety.

BACKGROUND

1. Field

Embodiments relate to a method of forming a mask pattern and a method of fabricating a semiconductor device using the same.

2. Description of the Related Art

As semiconductor devices have been highly integrated, an area occupied by each unit cell has become smaller. To address the reduction in area of each unit cell, a design rule may have a nano-scale less than several to tens of nanometers, and as a result, patterns may increase in aspect ratio.

SUMMARY

The embodiments may be realized by providing a method of forming a mask pattern, the method including providing a substrate including a plurality of patterns thereon; forming a mask material solution layer such that the mask material solution layer covers the patterns on the substrate; and applying a liquid material to remove an upper portion of the mask material solution layer, wherein the mask material solution layer includes a fluorine additive concentrated at the upper portion of the mask material solution layer.

The embodiments may be realized by providing a method of fabricating a semiconductor device, the method including forming a plurality of recesses on a substrate; dispensing a mask material solution on the substrate, the mask material solution including a fluorine additive; dividing the dispensed mask material solution into a first layer and a second layer; curing at least a portion of the first layer; and removing the second layer, wherein the fluorine additive is concentrated in the second layer, and removing the second layer includes using a solution that has an affinity to the fluorine additive.

BRIEF DESCRIPTION OF THE DRAWINGS

Features will be apparent to those of skill in the art by describing in detail exemplary embodiments with reference to the attached drawings in which:

FIGS. 2, 3A, 3B, 4A, 4B, 5A, 5B, 6, and 7 illustrate cross-sectional views of stages in a method of forming a mask pattern according to some example embodiments.

FIGS. 13 to 22 illustrate cross-sectional views taken along line I-I' of FIG. 12A, showing stages in a method of fabricating a semiconductor device according to some example embodiments.

DETAILED DESCRIPTION OF EMBODIMENTS

Figure 1:
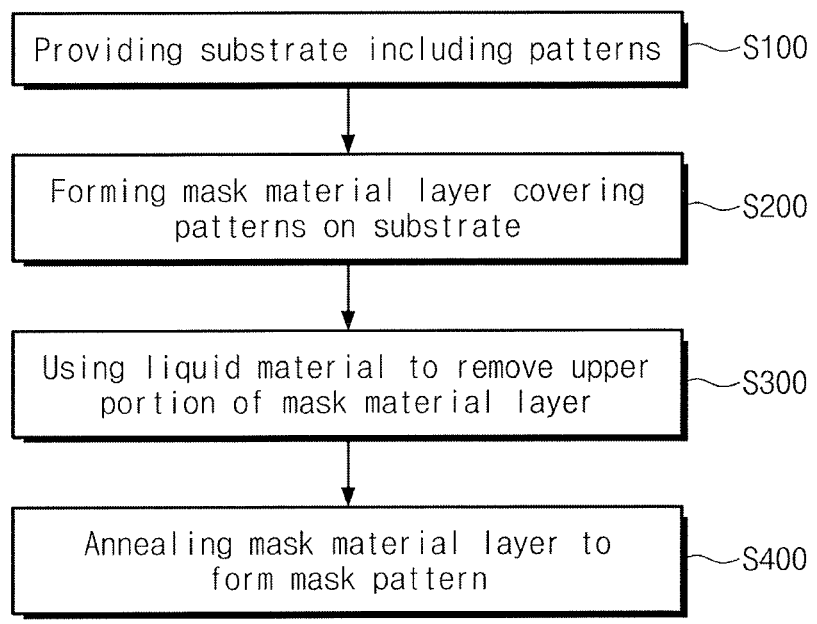
FIG. 1 illustrates a flow chart of a method of forming a mask pattern according to some example embodiments.

FIG. 1 illustrates a flow chart of a method of forming a mask pattern according to some example embodiments. FIGS. 2, 3A, 3B, 4A, 4B, 5A, 5B, 6, and 7 illustrate cross-sectional views of stages in a method of forming a mask pattern according to some example embodiments.

Figure 2:
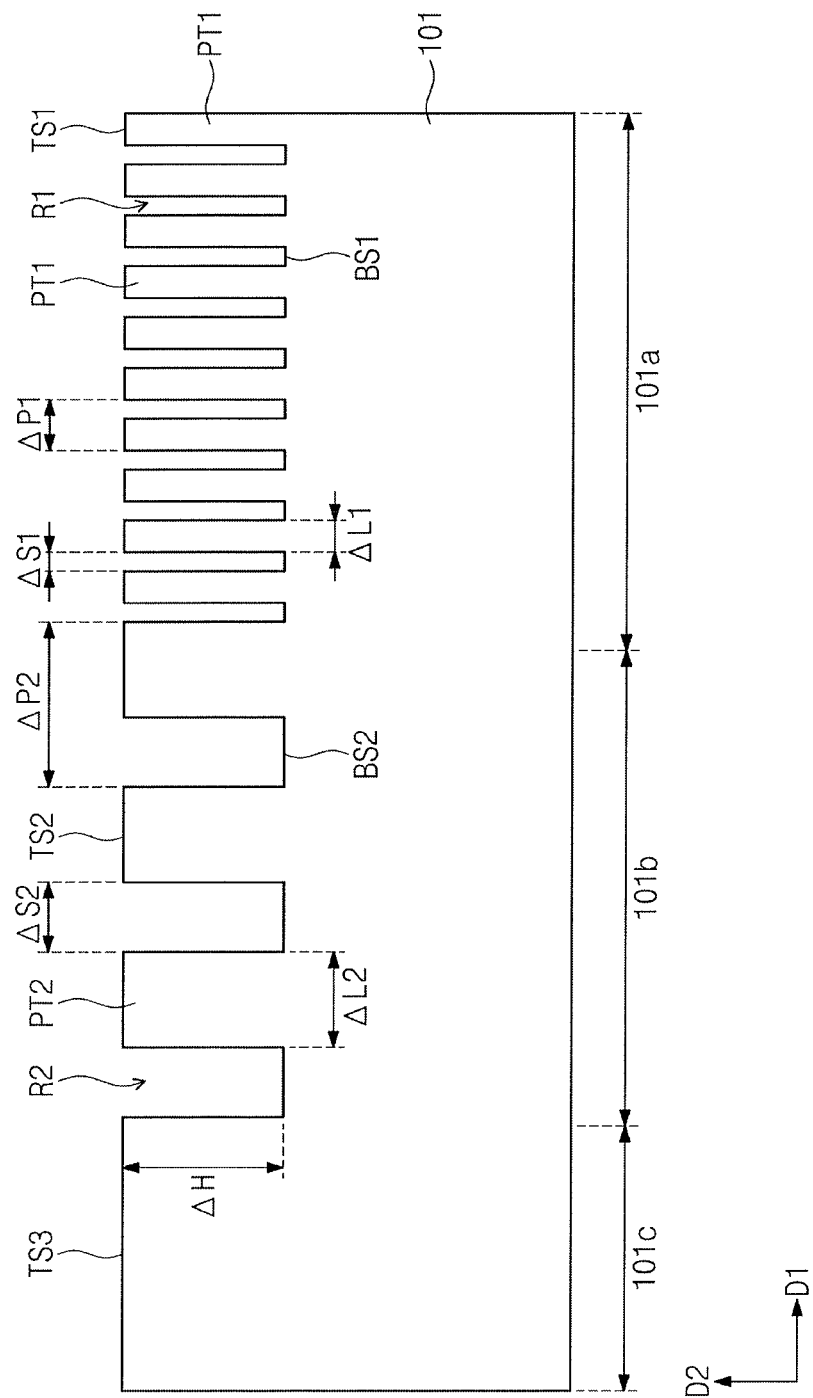

Referring to FIGS. 1 and 2, a substrate 101 including patterns may be provided (S100).

The substrate 101 may include a semiconductor substrate. In an implementation, the substrate 101 may include a semiconductor, e.g., Si or Ge. In an implementation, the substrate 101 may include a compound semiconductor, e.g., SiGe, SiC, GaAs, InAs, or InP. In an implementation, the substrate 101 may have a silicon-on-insulator (SOI) structure. In an implementation, the substrate 101 may include a conductive region, e.g., an impurity-doped well or an impurity-doped structure. In an implementation, the substrate 101 may have various device isolation structures, such as a shallow trench isolation structure. In an implementation, the substrate 101 may be provided thereon with semiconductor devices, e.g., transistors or diodes. In an implementation, the substrate 101 may be provided thereon with a plurality of wiring lines that are arranged in a multi-layered structure and are electrically separated from each other by one or more interlayer dielectric layers. In an implementation, the substrate 101 may include a dielectric layer or a conductive layer. In an implementation, the substrate 101 may include, e.g., a metal, an alloy, a metal carbide, a metal nitride, a metal oxynitride, a metal oxycarbide, a semiconductor, a polysilicon, an oxide, a nitride, an oxynitride, a hydrocarbon compound, or any combination thereof.

The patterns may include, e.g., first patterns PT1 and second patterns PT2. The first patterns PT1 and the second patterns PT2 may include regularly repeating patterns along a first direction D1. In an implementation, the first patterns PT1 and the second patterns PT2 may include irregular patterns.

The substrate 101 may have an area defined as a first region 101a (on which the first patterns PT1 are disposed), another area defined as a second region 101b (on which the second patterns PT2 are disposed), and yet another area defined as a third region 101c (on which no patterns are disposed).

For example, the first region 101a may be a cell region of a memory device, the second region 101b may be a core region of the memory device, and the third region 101c may be a peripheral region of the memory device.

First recesses R1 may be between the first patterns PT1. Second recesses R2 may be between the second patterns PT2.

The first pattern PT1 may have a width ΔL1 in the first direction, and the first recess R1 adjacent to (e.g., directly adjacent to) the first pattern PT1 may have a width ΔS1 in the first direction D1. A sum of the widths ΔL1 and ΔS1 may be defined as a first pitch ΔP1. The second pattern PT2 may have a width ΔL2 in the first direction, and the and the second recess R2 adjacent to (e.g., directly adjacent to) the second pattern PT2 may have a width ΔS2 in the first direction D1. A sum of the widths ΔL2 and ΔS2 may be defined as a second pitch ΔP2. Each of the first pitch ΔP1 and the second pitch ΔP2 may be a pixel pitch.

The second pitch ΔP2 may be greater than the first pitch ΔP1. For example, the width ΔL2 in the first direction D1 of the second pattern PT2 may be greater than the width ΔL1 in the first direction D1 of the first pattern PT1. In an implementation, the width ΔS2 of the second recess R2 in the first direction D1 may be greater than or equal to the width ΔS1 of the first recess R1 in the first direction D1. For example, the first patterns PT1 may be formed denser (e.g., with a greater density) along the first direction D1 than the second patterns PT2. As used herein, the description of the patterns being dense may mean that the repetition period of patterns is shorter, or that the number of patterns per unit area is larger. A repetition period of the first patterns PT1 on the first region 101a may be shorter than a repetition period of the second patterns PT2 on the second region 101b, and thus it will be understood that the first patterns PT1 may be denser than the second patterns PT2.

The first pattern PT1 and the second pattern PT2 may have the same height ΔH in a second direction D2. The first pattern PT1 may have a top surface TS1, the second pattern PT2 may have a top surface TS2, and the third region 101c of the substrate 101 may have a top surface TS3, which top surfaces TS1, TS2, and TS3 may be located at substantially the same level (e.g., may be coplanar). The first recess R1 may have a bottom surface BS1 at a level substantially the same as or different from that of a bottom surface BS2 of the second recess R2.

Referring to FIGS. 1, 3A, 3B, 4A, and 4B, a mask material layer 201 may be formed on the substrate 101, covering the first and second patterns PT1 and PT2 (S200).

Figure 3B:
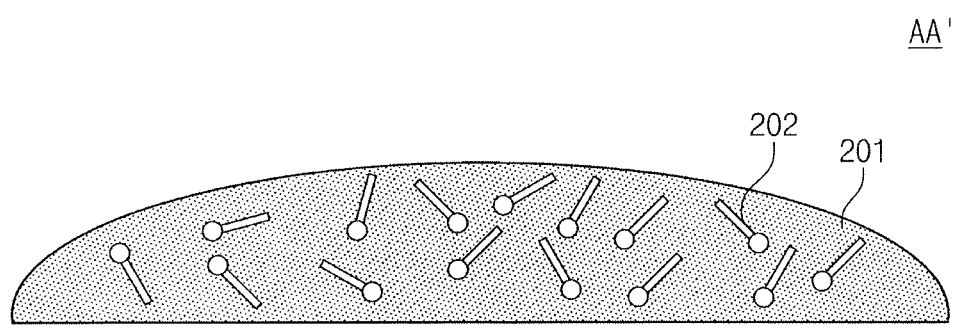

FIG. 3A shows that a solution may be dispensed or applied on the substrate 101. FIG. 3B shows an enlarged conceptual view showing section AA' of FIG. 3A. The solution used for the formation of the mask material solution layer 201 (see FIG. 4A) may be called hereinafter a mask material solution.

The first patterns PT1 and the second patterns PT2 may be covered with the mask material solution. The first recesses R1 and the second recesses R2 may be filled with the mask material solution.

In an implementation, the mask material solution layer 201 may include a carbon material, e.g., a hydrocarbon compound having an aromatic repeating unit. In an implementation, the mask material solution may be, e.g., a spin-on hardmask solution. In an implementation, the mask material solution may include, e.g., a fluorine additive 202, a monomer, a cross-linking agent, and a hydrophobic solvent. The fluorine additive 202 may be hydrophobic.

The fluorine additive 202 may include a material whose surface energy is low. In an implementation, the mask material solution may not include the fluorine additive 202, but instead may include, e.g., a compound whose surface energy is low.

A section AA' may be defined to indicate an arbitrary region in an upper portion of the dispensed mask material solution. The mask material solution may have a hemispherical shape having a curvature at a portion in contact with air. The fluorine additive 202 may be distributed all over (e.g., uniformly within) the mask material solution.

In an implementation, the fluorine additive 202 may be, e.g., a branched and/or cyclic polymer compound containing fluorine. In an implementation, the fluorine additive 202 may include, e.g., polyvinyl fluoride, polyvinylidene fluoride, polytrifluoroethylene, polychlorotrifluoroethylene (PCTEE), fluorinated ethylene propylene, paraffin, polytetrafluoroethylene, or poly(hexafluoropropylene).

In an implementation, the monomer may include, e.g., a pyrene derivative, a naphthalene derivative, an anthracene derivative, a phenanthrene derivative, a fluorene derivative, a phthalic anhydride derivative, a naphthacene derivative, a fluoanthracene derivative, a tetraphene derivative, a perylene derivative, a chrysene derivative, a dibenzoanthracene derivative, a pentaphene derivative, a coronene derivative, a pentacene derivative, a hexacene derivative, an antanthrene derivative, an ovalene derivative, a pyranthrene derivative, an acenaphthene derivative, an acenaphthylene derivative, a fluoranthene derivative, a fluoranthene derivative, or a triphenylene derivative.

In an implementation, the cross-linking agent may include, e.g., an isocyanate cross-linking agent, a peroxide cross-linking agent, an epoxy cross-linking agent, or an amine cross-linking agent. A compound related to the isocyanate cross-linking agent may include, e.g., an isocyanate monomer, such as tolylene diisocyanate, chlorphenylene diisocyanate, tetramethylene diisocyanate, xylylene diisocyanate, diphenylmethane diisocyanate, and hydrogenated diphenylmethane diisocyanate; an isocyanate compound in which these isocyanate monomers are added to trimethylolpropane; an isocyanurate compound; a burette-type compound; and an urethane prepolymer-type isocyanate prepared by additional reaction of polyether polyol, polyester polyol, acrylic polyol, polybutadiene polyol, or polyisoprene polyol. For example, the compound may be a polyisocyanate compound, and may include one or more of hexamethylene diisocyanate, hydrogenated xylylene diisocyanate, isophorone diisocyanate, and a polyisocyanate compound derived therefrom.

In an implementation, the peroxide cross-linking agent may include, e.g., di(2-ethylhexyl)peroxy dicarbonate, di(4-t-butylcyclohexyl)peroxy dicarbonate, di-sec-butylperoxy dicarbonate, t-butylperoxy neodecanoate, t-hexylperoxy pivalate, t-butylperoxy pivalate, dilauroyl peroxide, di-n-octanoyl peroxide, 1,1,3,3-tetramethylbutylperoxy-2-ethylhexanoate, di(4-methylbenzoyl)peroxide, dibenzoyl peroxide, t-butylperoxy isobutyrate, or 1,1-di(t-hexylperoxy) cyclohexane.

In an implementation, the epoxy cross-linking agent may include, e.g., N,N,N',N'-tetraglycidyl-m-xylenediamine, diglycidyl aniline, 1,3-bis(N,N-diglycidyl aminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglyceral polyglycidyl ether, sorbitan polyglycidyl ether, trimethylolpropane polyglycidyl ether, adipate diglycidyl ester, o-phthalic acid diglycidyl ester, triglycidyl-tris(2-hydroxyethyl)isocyanurate, resorcin diglycidyl ether, or bisphenol-S-diglycidyl ether.

In an implementation, the amine cross-linking agent may include a compound having, e.g., a plurality of amino groups, such as ethylenediamines. In an implementation, the ethylenediamines may include, e.g., ethylenediamine, 1,2-diaminopropane, 1,2-diamino-2-methylpropane, N-methyl-ethylenediamine, N-ethyl-ethylenediamine, N-isopropyl-ethylenediamine, N-cyclohexyl-ethylenediamine, N-cyclohexyl-ethylenediamine, N-octyl-ethylenediamine, N-decyl-ethylenediamine, N-dodecyl-ethylenediamine, N,N-dimethyl-ethylenediamine, N,N-diethyl-ethylenediamine, N,N'-diethyl-ethylenediamine, N,N'-diisopropyl ethylenediamine, N,N,N'-trimethyl-ethylenediamine, diethylenetriamine, N-isopropyl-diethylenetriamine, N-(2-aminoethyl)-1,3-propanediamine, triethylenetetramine, N,N'-bis(3-aminopropyl)ethylenediamine, N,N'-bis (2-aminoethyl)-1,3-propanediamine, tris(2-aminoethyl)amine, tetraethylenepentamine, pentaethylene hexamine, 2-(2-aminoethylamino)ethanol, N,N-bis(hydroxyethyl) ethylenediamine, N-(hydroxyethyl)diethylenetriamine, N-(hydroxyethyl)triethylenetetramine, piperazine, 1-(2-aminoethyl)piperazine, 4-(2-aminoethyl)morpholine, and polyethyleneimine. Besides the ethylenediamines, diamines or polyamines may include one or more of 1,3-diaminopropane, 1,4-diaminobutane, 1,3-diaminopentane and 1,5-diminopemane, 2,2-dimethyl-1,3-propanediamine, hexamethylenediamine, 2-methyl-1,5-diaminopropane, 1,7-diaminoheptane, 1,8-diaminooctane, 2,2,4-trimethyl-1,6-hexanediamine, 2,4,4-trimethyl-1,6-hexanediamine, 1,9-diaminononane, 1,10-diaminodecane, 1,12-diaminododecane, N-methyl-1,3-propanediamine, N-ethyl-1,3-propanediamine, N-isopropyl-1,3-propanediamine, N,N-dimethyl-1,3-propanediamine, N,N'-dimethyl-1,3-propanediamine, N,N'-diethyl-1,3-propanediamine, N,N'-diisopropyl-1,3-propanediamine, N,N,N'-trimethyl-1,3-propanediamine, 2-butyl-2-ethyl-1,5-pentanediamine, N,N'-dimethyl-1,6-hexanediamine, 3,3'-diamino-N-methyl-dipropylamine, N-(3-aminopropyl)-1,3-propanediamine, spermidine, bis(hexamethylene)triamine, N,N',N''-trimethyl-bis(hexamethylene)triamine, 4-amino-1,8-octanediamine, N,N'-bis(3-aminopropyl)-1,3-propiediamine, spermine, 4,4'-methylenebis(cyclohexylamine), 1,2-diaminocyclohexane, 1,4-diaminocyclohexane, 1,3-eyclohexane bis(methylamine), 1,4-cyclohexane bis (methylamine), 1,2-bis(aminoethoxy)ethane, 4,9-dioxa-1, 12-dodecanediamine, 4,7,10-trioxa-1,13-tridecanediamine, 1,3-diamino-hydroxy-propane, 4,4-methylene dipiperidine, 4-(aminomethyl)piperidine, 3-(4-aminobutyl)piperidine, or polyallylamine.

In an implementation, the hydrophobic solvent may include, e.g., propylene glycol monomethyl ether acetate (PGMEA), propylene glycol monomethyl ether (PGME), propylene glycol propyl ether (PGPE), cyclohexanone, N-methyl-2-pyrrolidone (NMP), γ-butyrolactone (GBL), 2-hydroxyisobutyric acid methylester (HBM), dimethyl sulfoxide (DMSO), or ethyl lactate (EL).

In an implementation, the mask material solution may be a mixture solution of, e.g., the fluorine additive 202, the monomer, the cross-linking agent, and the hydrophobic solvent.

Figure 4A:
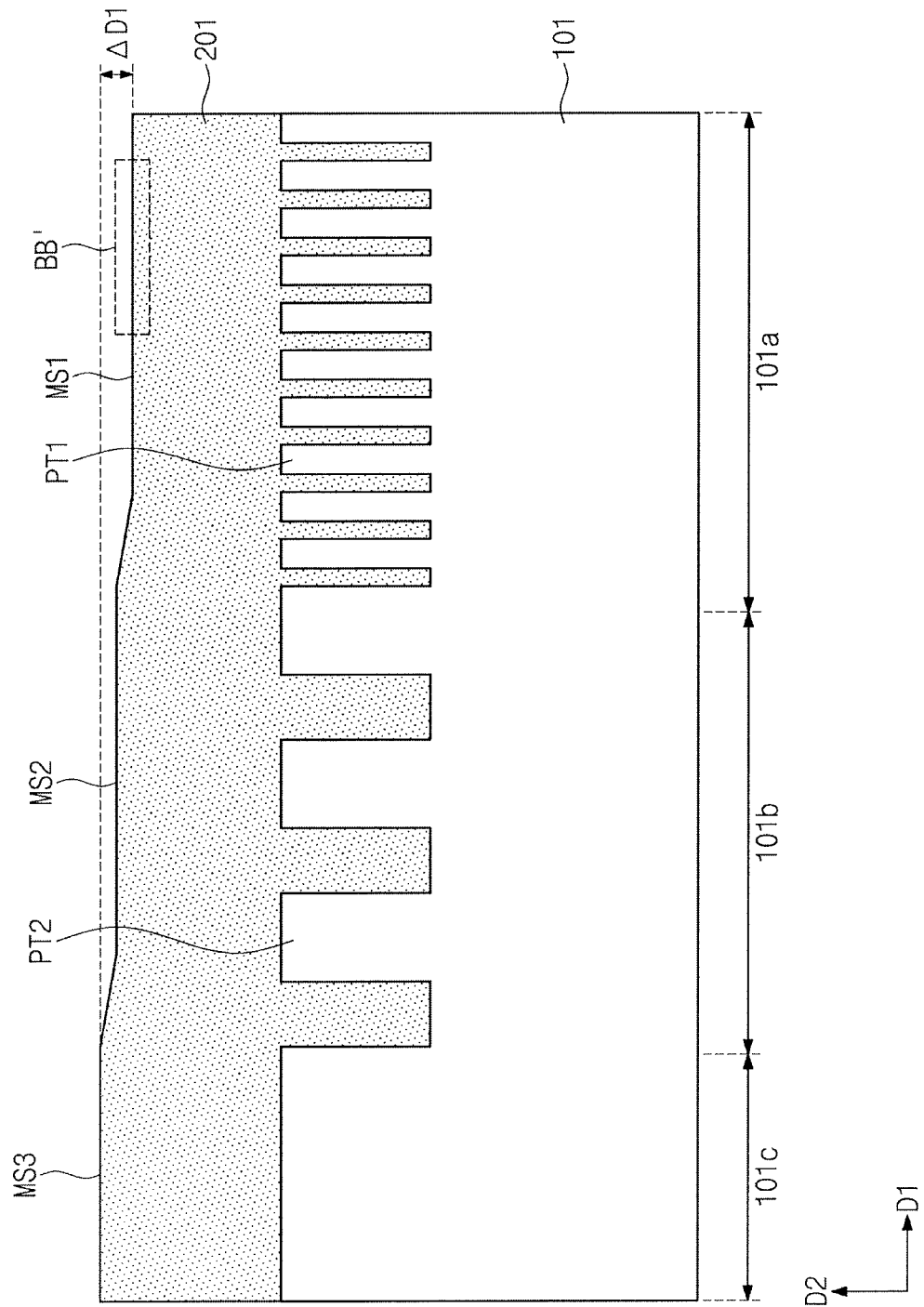
Figure 4B:
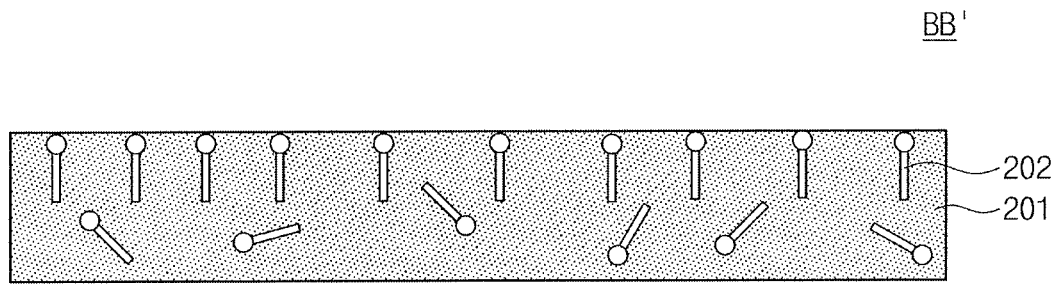

FIG. 4A illustrates a stage in which the mask material solution is coated on the substrate 101. FIG. 4B illustrates an enlarged view showing section BB' of FIG. 4A.

Referring to FIGS. 4A and 4B, simultaneously with or after the dispensing of the mask material solution, a spin coating process may be performed to form the mask material solution layer 201. The substrate 101 may be evenly coated with the mask material solution layer 201 on an entire top surface thereof while the substrate 101 is rotated. Throughout the first, second, and third regions 101a, 101b, and 101c, the mask material solution layer 201 may have an average thickness of about 200 nm to about 1,000 nm (in the second direction D2 from the top surface of the substrate 101).

The mask material solution layer 201 may have a top surface MS1 on the first region 101a, a top surface MS2 on the second region 101b, and a top surface MS3 on the third region 101c. The top surfaces MS1. MS2, and MS3 may be located at different levels from each other (e.g., may be different distances from the corresponding top surfaces TS1, TS2, and TS3 of the first, second, and third regions 101a, 101b, and 101c in the second direction D2).

For example, the mask material solution layer 201 may be configured such that the top surfaces MS2 and MS3 respectively on the second and third regions 101b and 101c are located at a higher level than (e.g., farther from the substrate 101) that of the top surface MS1 on the first region 101a. The mask material solution layer 201 may have a height difference ΔD1 between the level of the top surface MS3 on the third region 101c and the level of the top surface MS1 on the first region 101a.

A section BB' may be defined to indicate an arbitrary region in an upper portion of the mask material solution layer 201. The hydrophobic solvent may be partially evaporated due to a high rotational speed of the substrate 101 during the spin coating process. When the hydrophobic solvent is evaporated, the hydrophobic fluorine additive 202 may migrate toward an upper portion of the mask material solution layer 201 (e.g., a portion of the mask material solution layer 201 that is distal to the substrate 101). For example, the molecules of the hydrophobic fluorine additive 202 may self-assemble to be concentrated at the upper portion of the mask material solution layer 201.

Figure 5B:
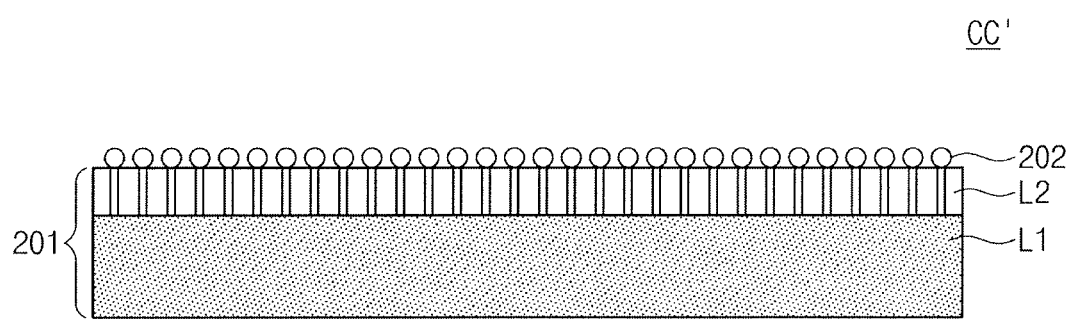

FIG. 5A illustrates a stage in which the mask material solution has been coated on the substrate 101. FIG. 5B illustrates an enlarged conceptual view showing section CC' of FIG. 5A.

Referring to FIGS. 5A and 5B, the mask material solution layer 201 may be physically divided into a first layer L1 and a second layer L2. The second layer L2 may be a layer in which the fluorine additive 202 is segregated or concentrated. For example, the hydrophobic fluorine additive 202 may generate a stronger attractive force with hydrophobic air than with the substrate 101, and the second layer L2 may remain separated from the first layer L1. In an implementation, a substrate-facing surface of the second layer L2 may be flat and uniform in height relative to the top surfaces of the substrate 101 (e.g., along with an upper surface of the first layer L1 that faces the second layer L2), and may be parallel with top surfaces of the substrate 101. Upper surfaces of the second layer L2, e.g., surfaces of the second layer L2 that face away from the substrate 101, may be non-uniform in height (in the second direction D2) and/or flatness.

Figure 6:
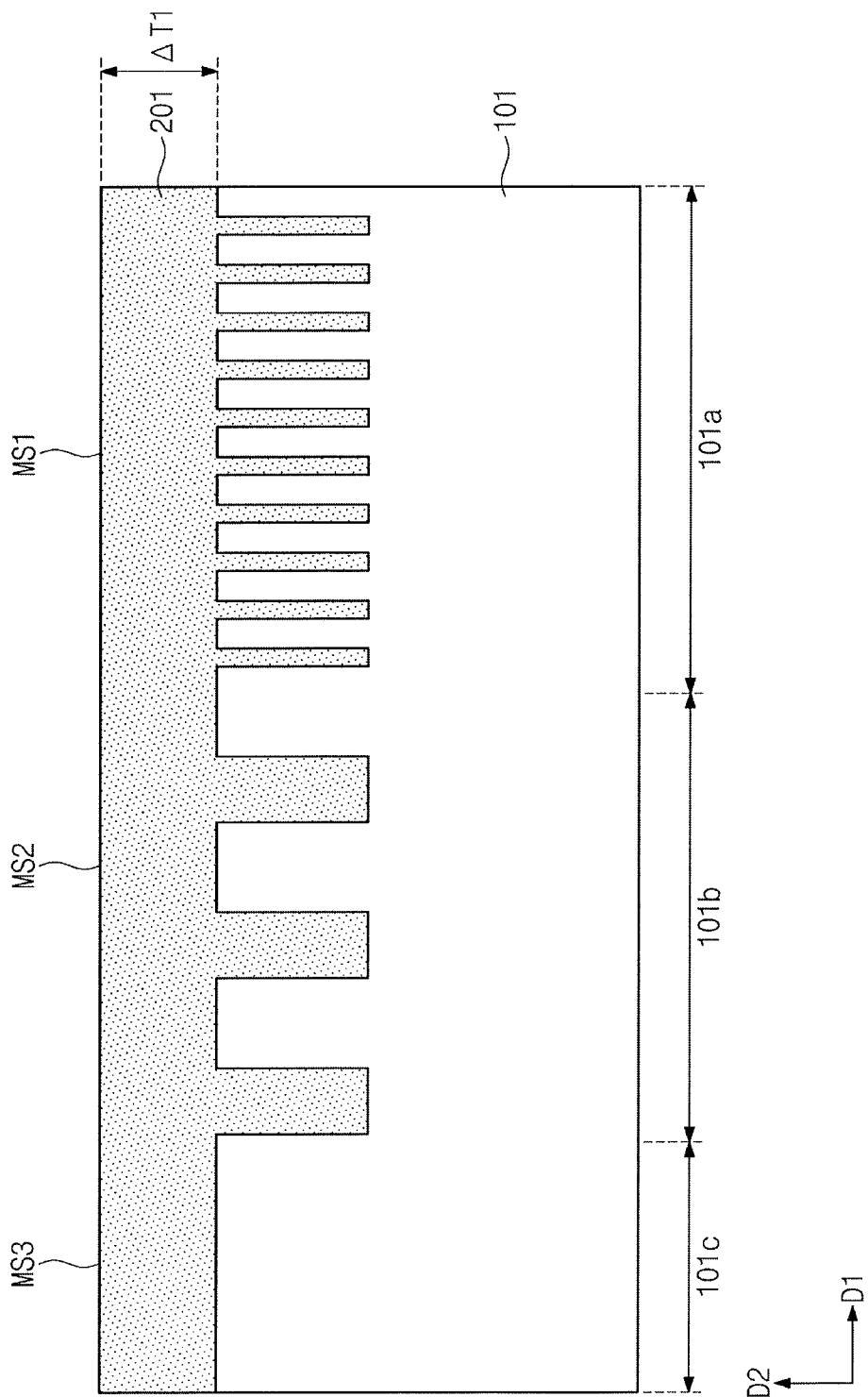

Referring to FIGS. 1 and 6, a liquid material may be used or applied to remove an upper portion of the mask material solution layer 201 (S300). The removed upper portion of the mask material solution layer 201 may be the second layer L2 (in which the fluorine additive 202 is segregated or concentrated).

For example, a rinse process may be performed to remove the upper portion of the mask material solution layer 201. The liquid material may include, e.g., a thinner, an alcohol, or a developer. The liquid material may have an affinity toward or solubility with respect to the fluorine additive 202 (e.g., the fluorine additive 202 may be soluble in or otherwise attracted to the liquid material), and may be used to remove or dilute the fluorine additive 202. For example, the first layer L1 of the mask material solution layer 201 may not be soluble or miscible with the liquid material, and may remain unaffected by the application of the liquid material.

During the removal of the second layer L2, the liquid material may be provided onto the mask material solution layer 201 as the substrate 101 is rotated. A centrifugal force may cause the liquid material (along with the fluorine additive 202 dissolved therein, e.g., the second layer L2) to move in a radial direction of the substrate 101, which may result in the removal of the second layer L2. The liquid material may be provided on the substrate 101 (e.g., on the mask material solution layer 201 on the substrate 101) for, e.g., about 4 seconds to about 60 seconds.

After the second layer L2 is removed, the top surfaces MS1, MS2, and MS3 of the mask material solution layer 201 may be located at substantially the same level on the first, second, and third regions 101a, 101b, and 101c (e.g., may be coplanar).

In an implementation, the mask material solution layer 201 may have a height difference of, e.g., equal to or less than about 15 nm, between the level of the top surface MS3 on the third region 101c and the level of the top surface MS1 on the first region 101a.

In an implementation, using or applying the liquid material to remove an upper portion of the mask material solution layer 201 may be omitted.

Figure 7:
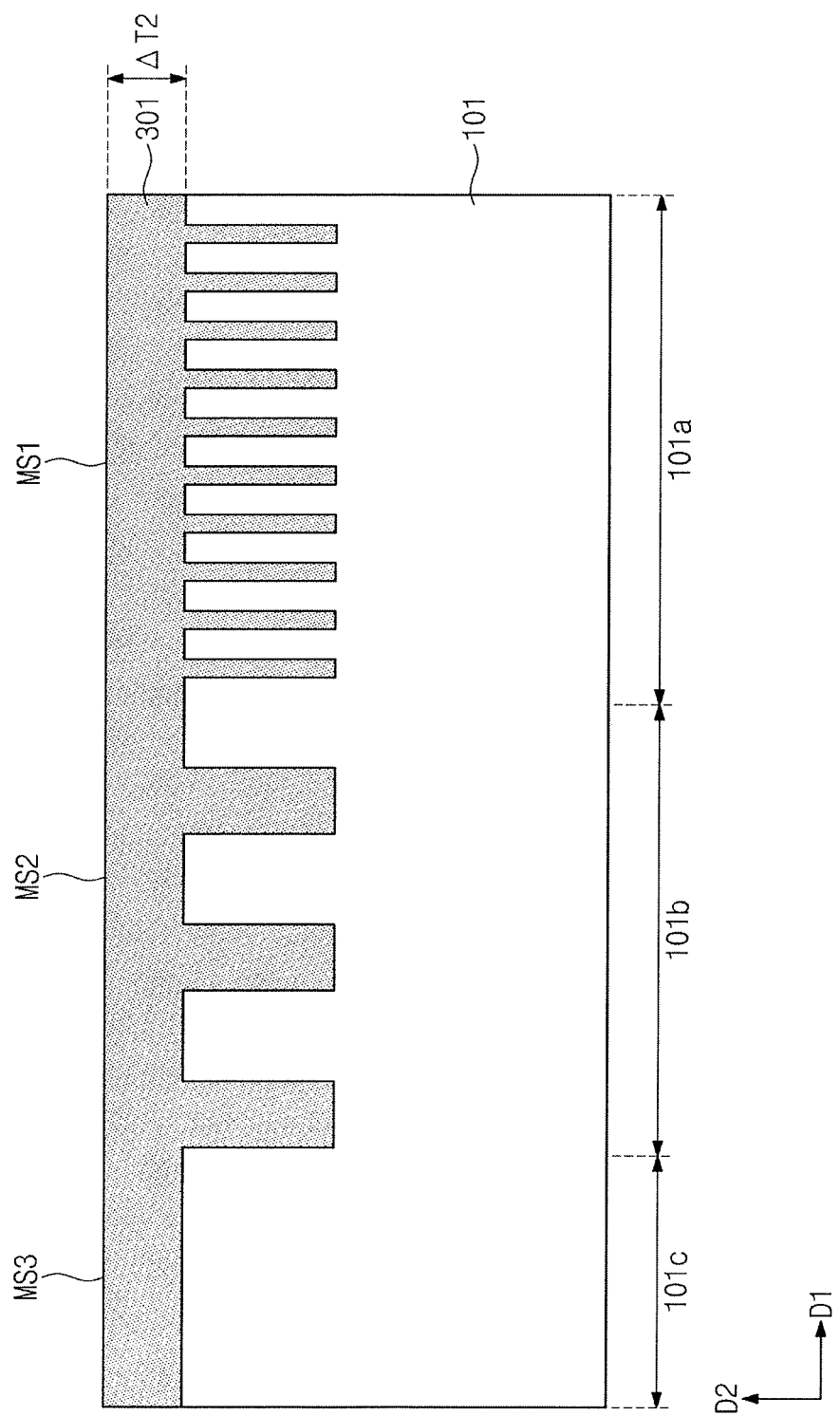

Referring to FIGS. 1 and 7, the mask material solution layer 201 may undergo an annealing process to form a mask pattern 301 (S400).

In an implementation, the mask material layer 201 may be annealed at temperatures of, e.g., about 380° C. to about 420° C. In an implementation, the mask material layer 201 may be annealed at a temperature of, e.g., about 400° C.

As remaining hydrophobic solvent may be completely evaporated from the mask material solution layer 201, a remaining fluorine additive 202 may also be removed from the mask material solution layer 201.

The mask material solution layer 201 may be cured into a solid mask pattern 301. The mask pattern 301 may be formed by polymerization of hydrocarbon monomers contained in the mask material solution layer 201.

The mask pattern 301 may have top surfaces MS1, MS2, and MS3 respectively on the first, second, and third regions 101a, 101b, and 101c, which top surfaces MS1, MS2, and MS3 may be located at substantially the same level. In an implementation mask pattern 301 may have a (negligible) height difference equal to or less than about 15 nm between the level of the top surface MS3 on the third region 101c and the level of the top surface MS1 on the first region 101a.

The mask pattern 301 may have an average thickness ΔT2 in the second direction D2 that is less than an average thickness ΔT1 (see FIG. 6) in the second direction D2 of the mask material solution layer 201.

In an implementation, even when the liquid material is not used or applied, an upper portion of the mask material solution layer 201 may be removed by the annealing. The mask material solution layer 201 may be annealed at temperatures of, e.g., about 380° C. to about 420° C. For example, the mask material layer 201 may be annealed at a temperature of, e.g., about 400° C. The hydrophobic solvent may be evaporated from the mask material solution layer 201, and segregated fluorine additive 202 may be removed from the mask material solution layer 201. The mask material solution layer 201 may be completely cured into a solid mask pattern 301.

The mask pattern 301 may have top surfaces MS1, MS2, and MS3 respectively on the first, second, and third regions 101a, 101b, and 101c, which top surfaces MS1, MS2, and MS3 may be located at substantially the same level.

Figure 8:
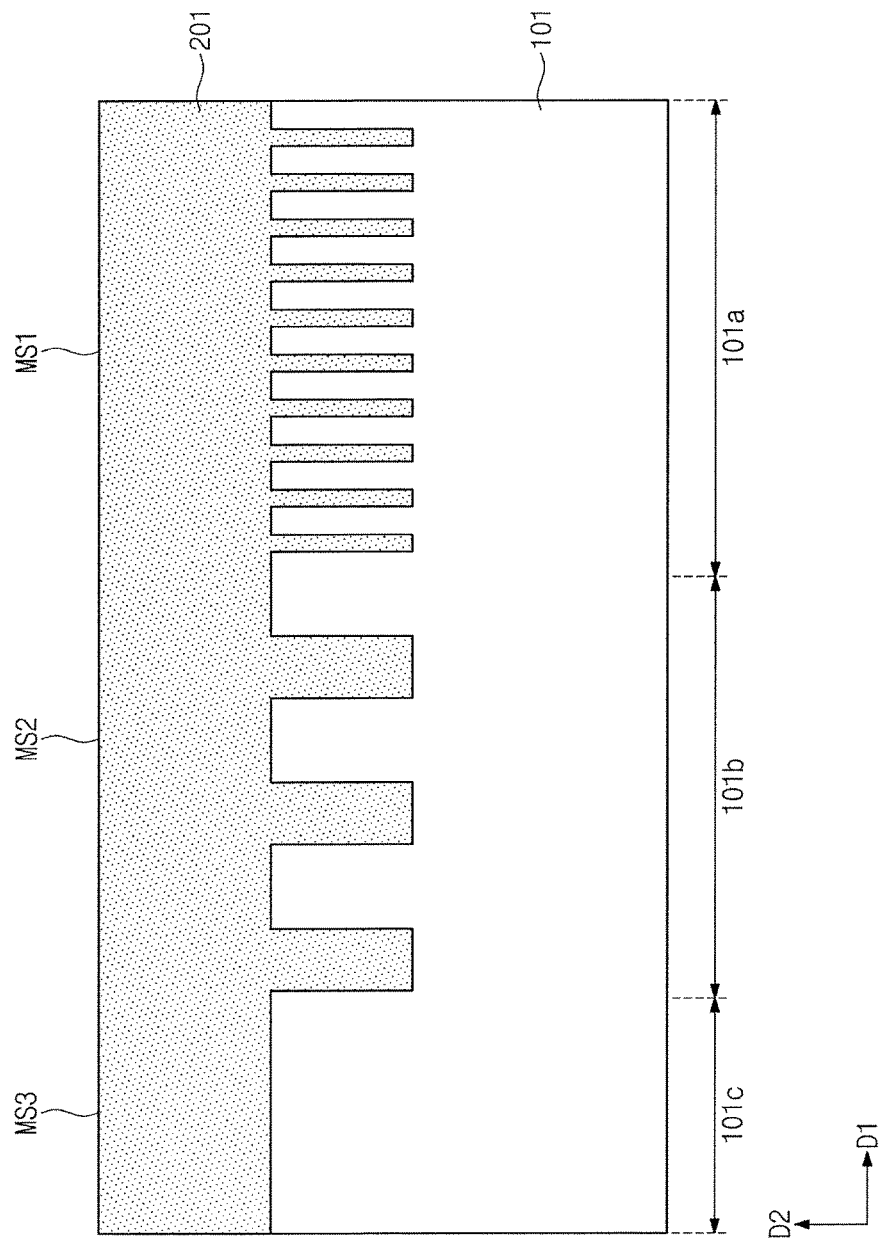
FIGS. 8 and 9 illustrate cross-sectional views of stages in a method of forming a mask pattern according to some example embodiments.
Figure 9:
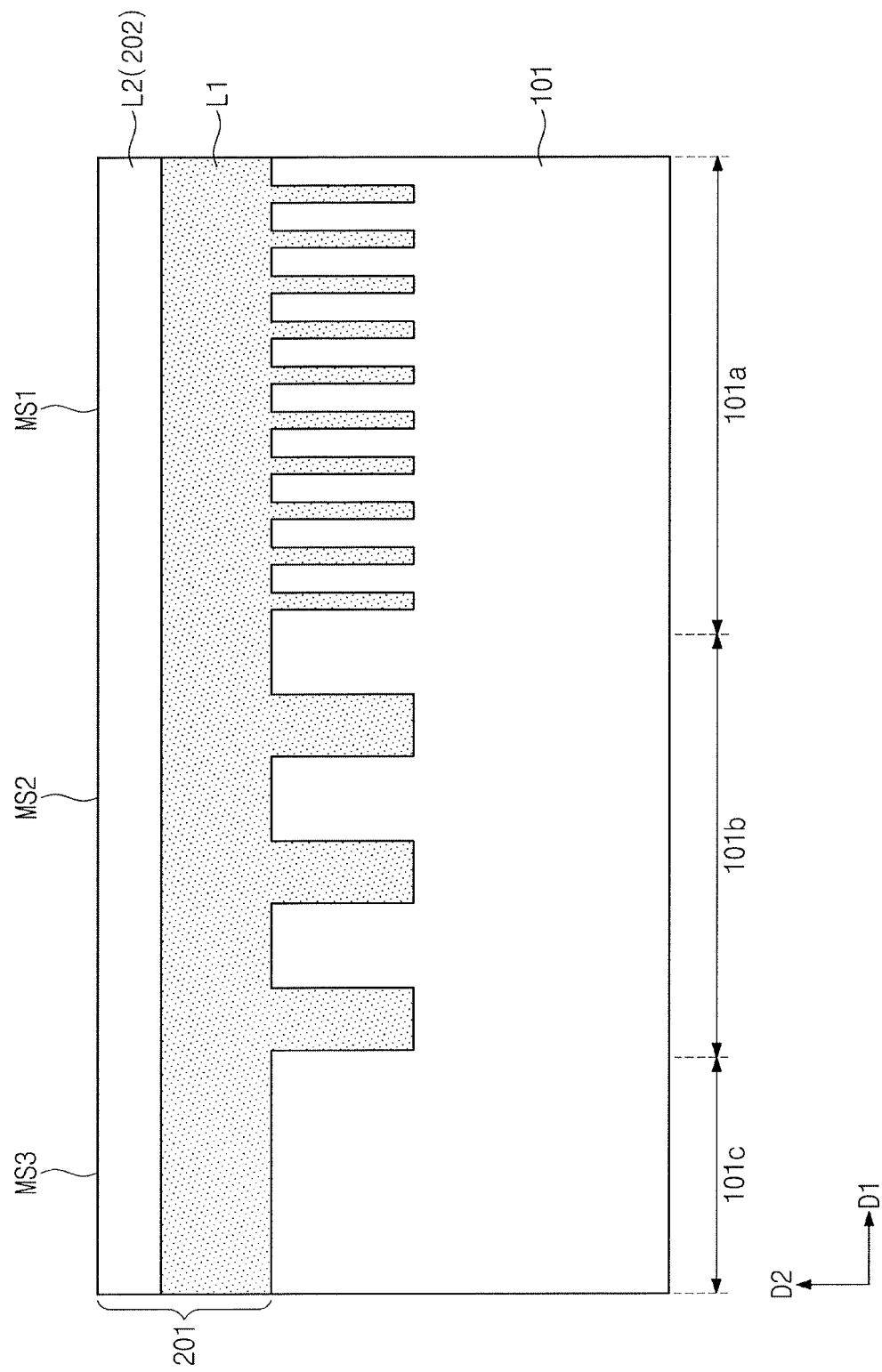

FIGS. 8 and 9 illustrate cross-sectional views of stages in a method of forming a mask pattern according to some example embodiments. Except as discussed below, the present embodiments have been described in detail with reference to FIGS. 2 to 7, and thus further repeated explanations may be omitted.

Referring to FIGS. 1, 8, and 9, the substrate 101 may be provided that includes the first region 101a, the second region 101b, and the third region 101c (S100), and then the mask material solution layer 201 may be formed on the first, second, and third regions 101a, 101b, and 101c (S200). The formation of the mask material solution layer 201 may be achieved by dispensing or applying the mask material solution, and thereafter or simultaneously performing the spin coating process.

During the spin coating process, the mask material solution may be provided or dispensed on the substrate 101 in an amount sufficient to allow that the top surfaces MS1, MS2, and MS3 of the mask material solution layer 201 to be located at substantially the same level on the first, second, and third regions 101a, 101b, and 101c.

During the spin coating process, the mask material solution layer 201 may be divided into the first layer L1 and the second layer L2. The second layer L2 may be a layer in which the fluorine additive 202 is segregated or concentrated as shown in FIG. 5B.

Then, the liquid material may be used to remove an upper portion (e.g., the second layer L2) of the mask material solution layer 201 (S300), and then the mask material solution layer 201 may be annealed to form the mask pattern 301 (S400).

Figure 10:
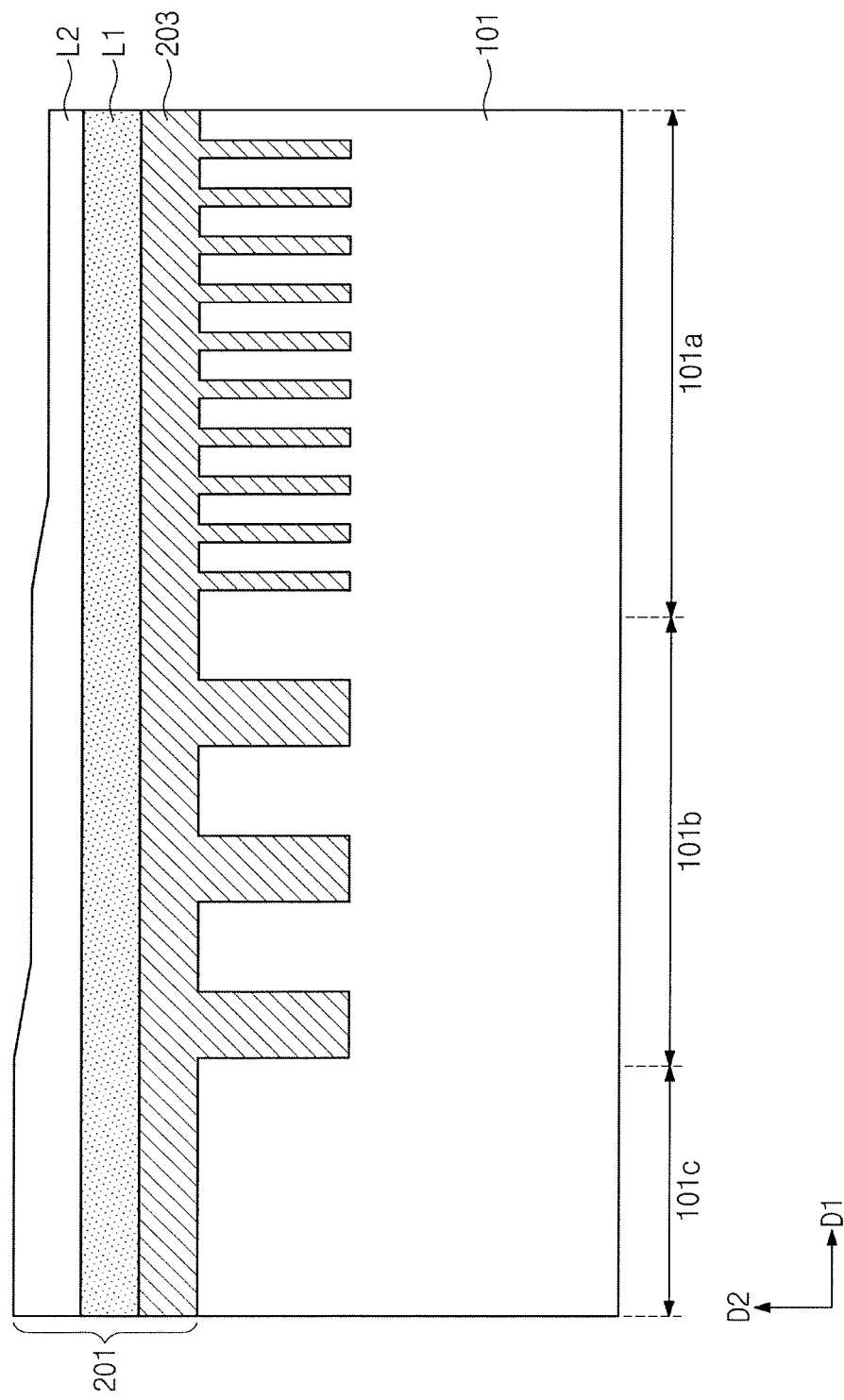
FIGS. 10 and 11 illustrate cross-sectional views of stages in a method of forming a mask pattern according to some example embodiments.
Figure 11:
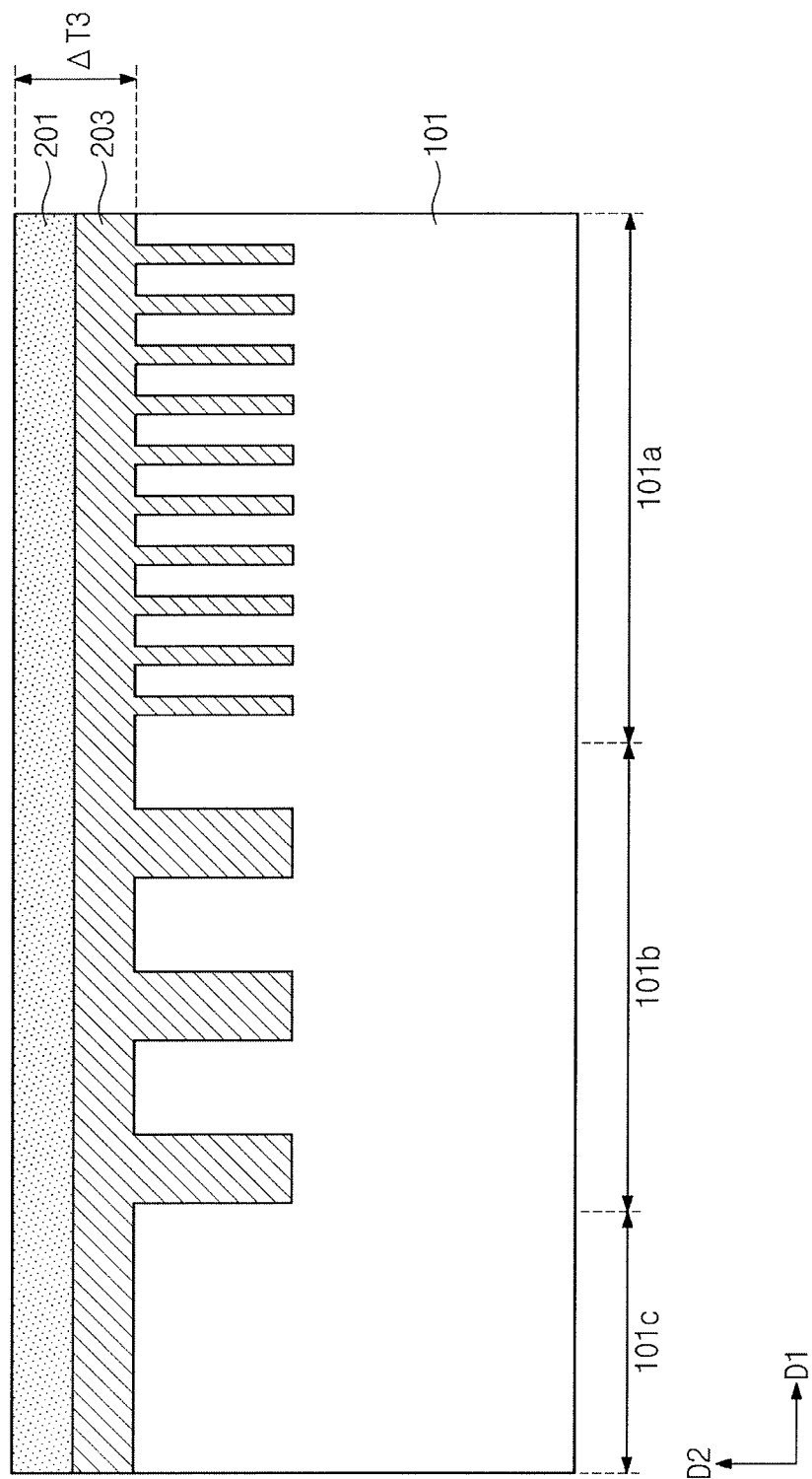

FIGS. 10 and 11 illustrate cross-sectional views of stages in a method of forming a mask pattern according to some example embodiments. Except as discussed below, the present embodiment has been described in detail with reference to FIGS. 2 to 7, and further repeated explanations may be omitted.

Referring to FIGS. 1 and 10, the substrate 101 may be provided that includes the first patterns PT1 and the second patterns PT2 (S100), and the mask material solution layer 201 may be formed to cover the first patterns PT1 and the second patterns PT2 (S200).

The formation of the mask material solution layer 201 may include spin-coating the mask material solution and then performing a first annealing process.

The spin coating process may physically divide the mask material layer 201 into the first layer L1 and the second layer L2.

The first annealing process may cure at least a portion of the first layer L1. For example, a lower portion of the first layer L1 (e.g., a portion of the first layer L1 proximate to the substrate 101) may be cured to from a cured mask material layer 203. The cured mask material layer 203 may be formed by polymerization of hydrocarbon monomers of the mask material solution layer 201.

In an implementation, the first annealing process may be performed in such a way that the substrate 101 may be provided with thermal energy from a heat source below the substrate 101 (e.g., the heat source may be on a side of the substrate 101 that is opposite to the side thereof that includes the mask material solution layer 201 thereon). In an implementation, the heat source may be provided within a stage or chuck on which the substrate 101 is loaded. For example, the heat source may be positioned opposite the mask material solution layer 201 on the substrate 101.

Heat generated from the heat source may be transferred through the stage or chuck toward a bottom surface of the substrate 101, and then transmitted conductively to the mask material solution layer 201. For example, the mask material solution layer 201 may be cured from or at a lower portion thereof, and an upper portion of the mask material solution layer 201 may be maintained in a non-cured state. The cured mask material layer 203 may not be easily removed by the liquid material. The non-cured mask material solution layer 201 may have high viscosity and thus may have different solubility to the liquid material from the solubility discussed with reference to FIG. 6.

The first annealing process may be performed at a temperature of about 80° C. to about 250° C. for about 10 seconds to about 5 minutes. In an implementation, the first annealing process may be performed at a temperature of about 120° C. to about 160° C. for about 15 seconds to about 1 minute. The condition of the first annealing process may vary depending on a kind of cross-linking agent of the mask material solution layer 201.

If the first annealing process were to be carried out at a higher temperature than that mentioned above and/or for a longer time than mentioned above, because the second layer L2 could possibly be cured, the first annealing process may stop before the curing of the second layer L2.

The cured mask material layer 203 may be adhered to the first patterns PT1 and the second patterns PT2. The hydrophobic solvent may be largely evaporated during the first annealing process, and in turn, the fluorine additive 202 may be easily segregated.

In an implementation, as illustrated in FIG. 10, the non-cured mask material solution layer 201 may include the first layer L1. In an implementation, the first layer L1 may also be converted into the cured mask material layer 203.

Referring to FIG. 11, the liquid material may remove the second layer L2, (or a layer including the segregated fluorine additive 202) as shown in FIG. 5B (S300).

Referring back to FIG. 7, a second annealing process may be performed to form the mask pattern 301 (S400). The mask material solution layer 201 may undergo the second annealing process at a temperature of about 380° C. to about 420° C. In an implementation, the second annealing process may be performed at a temperature of about 400° C.

The cured mask material layer 203 may be substantially the same as the mask pattern 301. Accordingly, after the second annealing process, the mask pattern 301 and the cured mask material layer 203 may have no boundary therebetween.

During the second annealing process, remaining solvent and fluorine additive 202 may be evaporated from the non-cured mask material solution layer 201. Therefore, the mask pattern 301 may have an average thickness $\Delta T2$ in the second direction D2 that is less than a sum $\Delta T3$ (see FIG. 11) of an average thickness in the second direction D2 of the mask material solution layer 201 and an average thickness in the second direction D2 of the cured mask material layer 203.

APPLICATION EXAMPLE

Figure 12A:
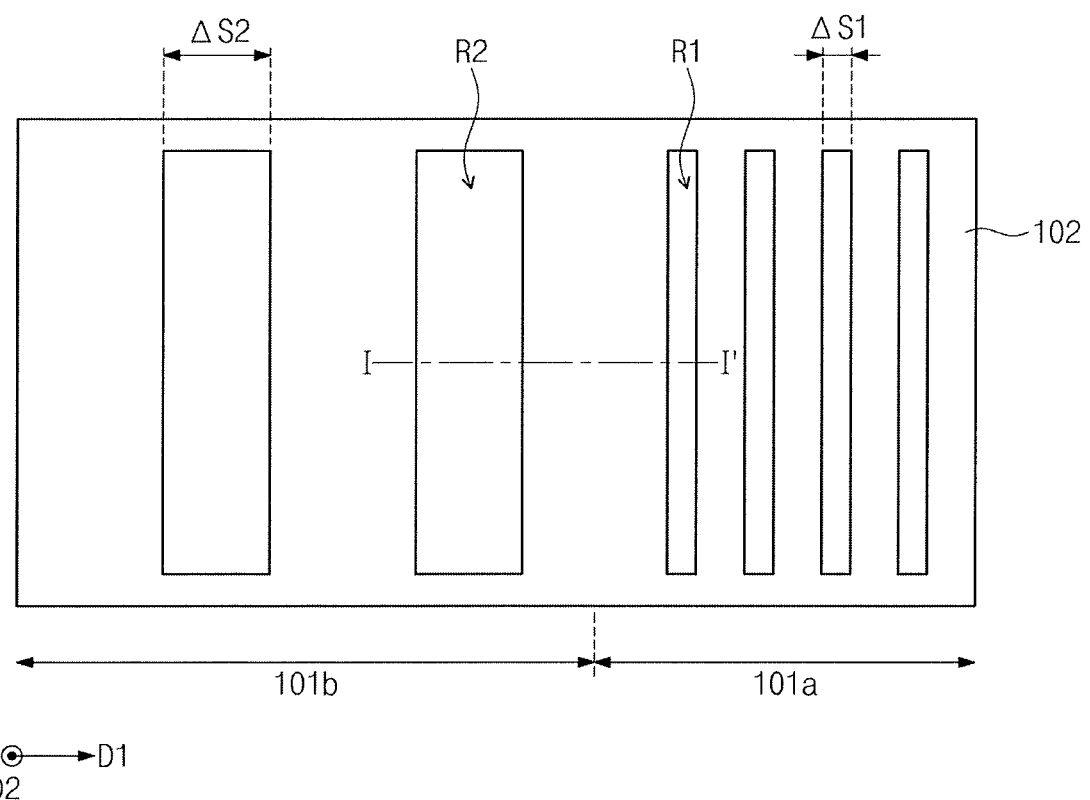
FIG. 12A illustrates a plan view of a stage in a method of fabricating a semiconductor device according to some example embodiments.
Figure 12B:
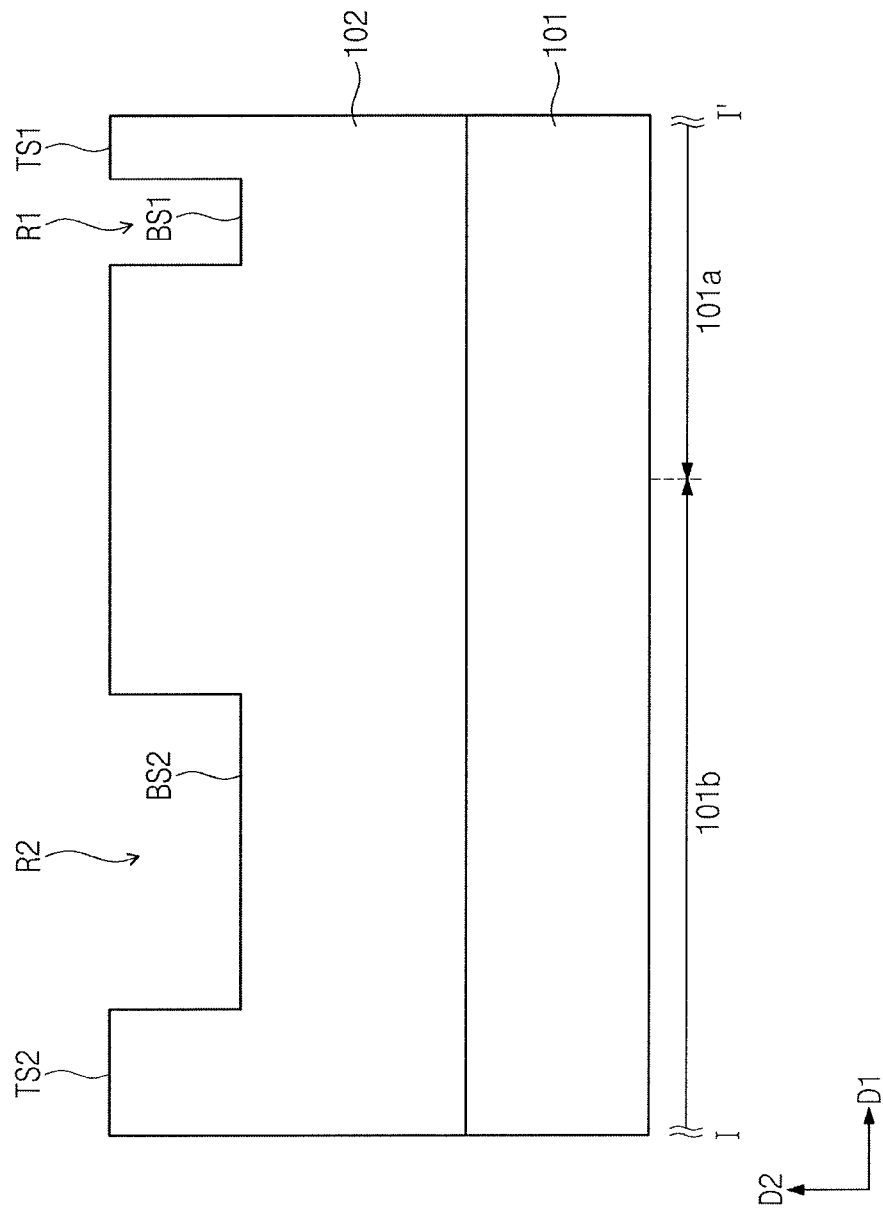
FIG. 12B illustrates a cross-sectional view taken along line I-I' of FIG. 12A, showing a stage in a method of fabricating a semiconductor device according to some example embodiments.

FIG. 12A illustrates a plan view of a stage in a method of fabricating a semiconductor device according to some example embodiments. FIG. 12B illustrates a cross-sectional view taken along line I-I' of FIG. 12A, showing a stage in a method of fabricating a semiconductor device according to some example embodiments. FIGS. 13 to 22 illustrate cross-sectional views taken along line I-I' of FIG. 12A, showing stages in a method of fabricating a semiconductor device according to some example embodiments.

Referring to FIGS. 12A and 12B, a dielectric layer 102 may be provided on a substrate 101. The dielectric layer 102 may include, e.g., silicon oxide.

First recesses R1 and second recesses R2 may be formed on the substrate 101, and may be spaced apart from each other along a first direction D1 parallel to a top surface of the substrate 101.

The substrate 101 may have an area defined as a first region 101a (on which the first recesses R1 are disposed) and another area defined as a second region 101b (on which the second recesses R2 are disposed).

In an implementation, the first region 101a may be a memory cell region on which are formed memory cells of a memory device, and the second region 101b may be a peripheral circuit region on which are formed peripheral circuits, e.g., high-voltage components, for driving the memory cells.

Each of the first recesses R1 may have a width $\Delta S1$ in the first direction D1, and each of the second recesses R2 may have a width $\Delta S2$ in the first direction D1. The width $\Delta S1$ of the first recess R1 may be less than the width $\Delta S2$ of the second recess R2.

The first recess R1 may have a bottom surface BS1 at a level substantially the same as or different from that of a bottom surface BS2 of the second recess R2. The dielectric layer 102 between the first recesses R1 may have a top surface TS1 at a level substantially the same as that of a top surface TS2 of the dielectric layer 102 between the second recesses R2.

Referring to FIGS. 13 and 14, a mask material solution layer 201 may be formed on the substrate 101. The mask material solution layer 201 may be formed by a spin coating process that dispenses a mask material solution.

The mask material solution layer 201 on the first region 101a may have a top surface MS1 at a lower level than that of a top surface MS2 of the mask material solution layer 201 on the second region 101b. The mask material solution layer 201 may have a height difference $\Delta D2$ between the level of the top surface MS2 on the second region 101b and the level of the top surface MS1 on the first region 101a.

A density of the first recesses R1 on the first region 101a may be greater than that of the second recesses R2 on the second region 101b, and the mask material solution layer 201 may have different top surface levels on the first and second regions 101a and 101b.

A spin coating process may physically divide the mask material solution layer 201 into a first layer L1 and a second layer L2. The second layer L2 may be a layer in which a fluorine additive 202 is segregated.

Figure 15:
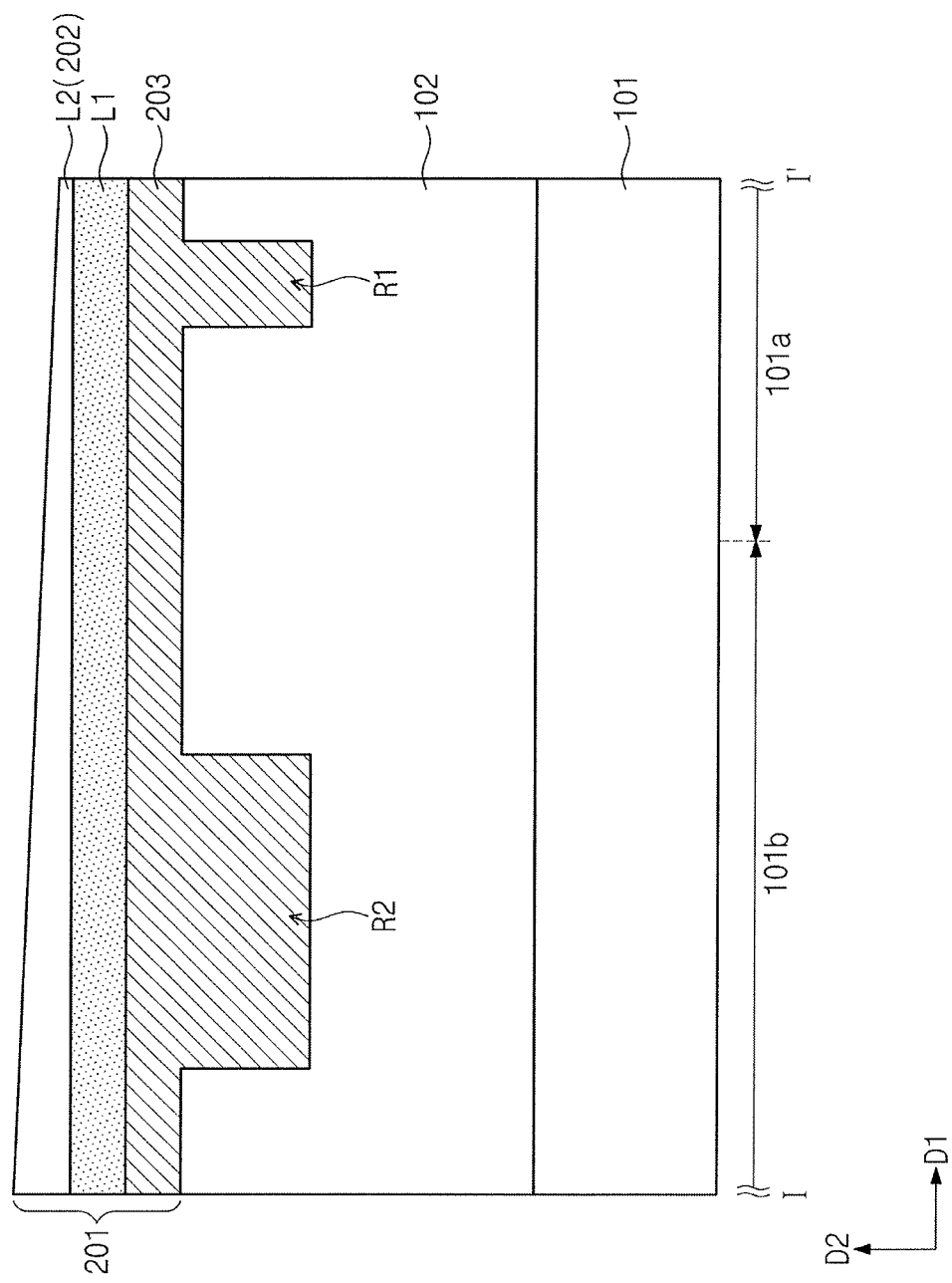

Referring to FIG. 15, a first annealing process may convert at least a portion of the first layer L1 into a cured mask material layer 203.

Figure 16:
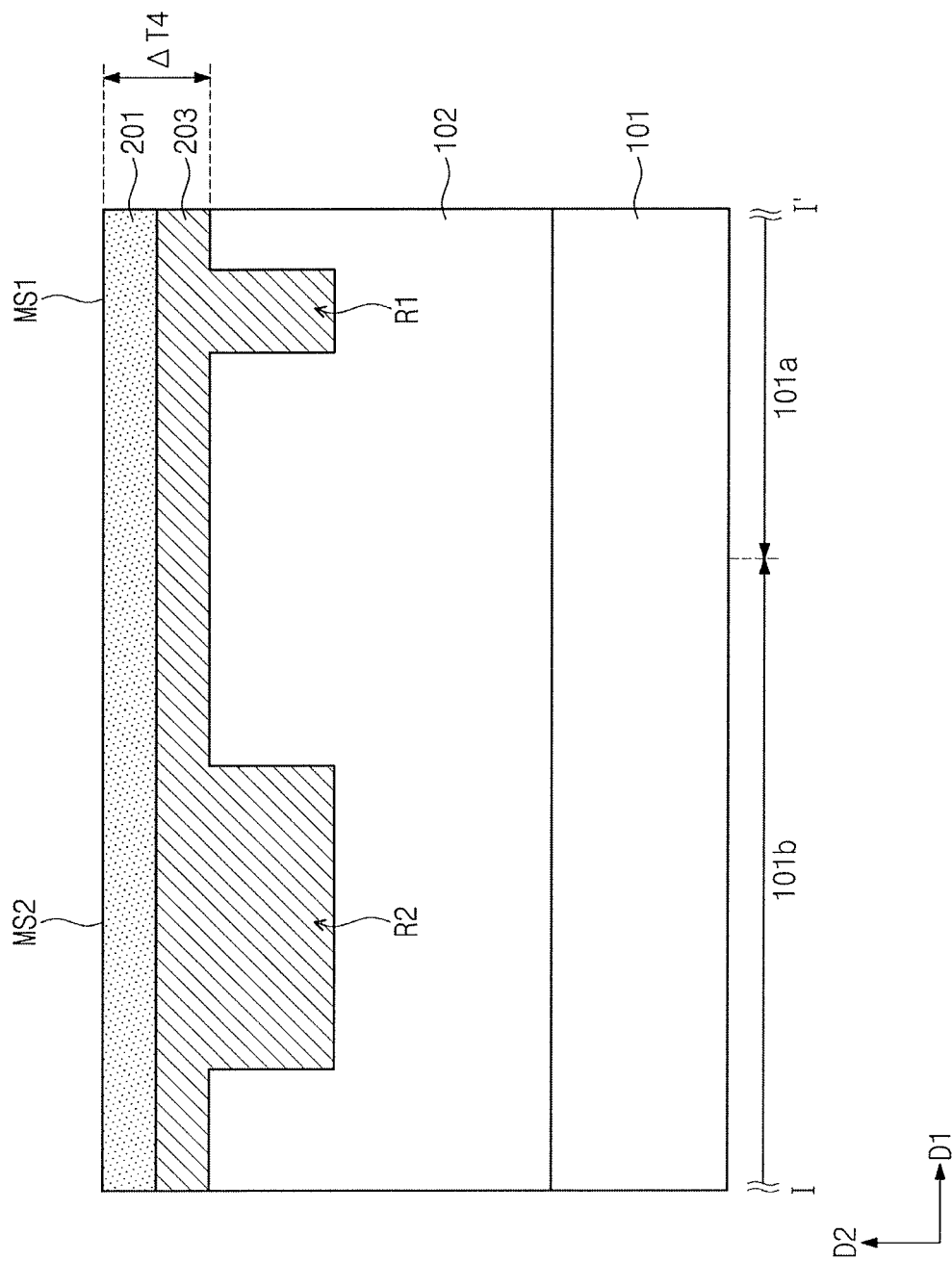

Referring to FIG. 16, a liquid material may be used remove the second layer L2. The mask material solution layer 201 remaining on the first region 101a may have a top surface MS1 at a level substantially the same as that of a top surface MS2 of the mask material solution layer 201 remaining on the second region 101b. The mask material solution layer 201 may have a (negligible) height difference equal to or less than about 15 nm between the level of the top surface MS1 on the first region 101a and the level of the top surface MS2 on the second region 101b.

Figure 17:
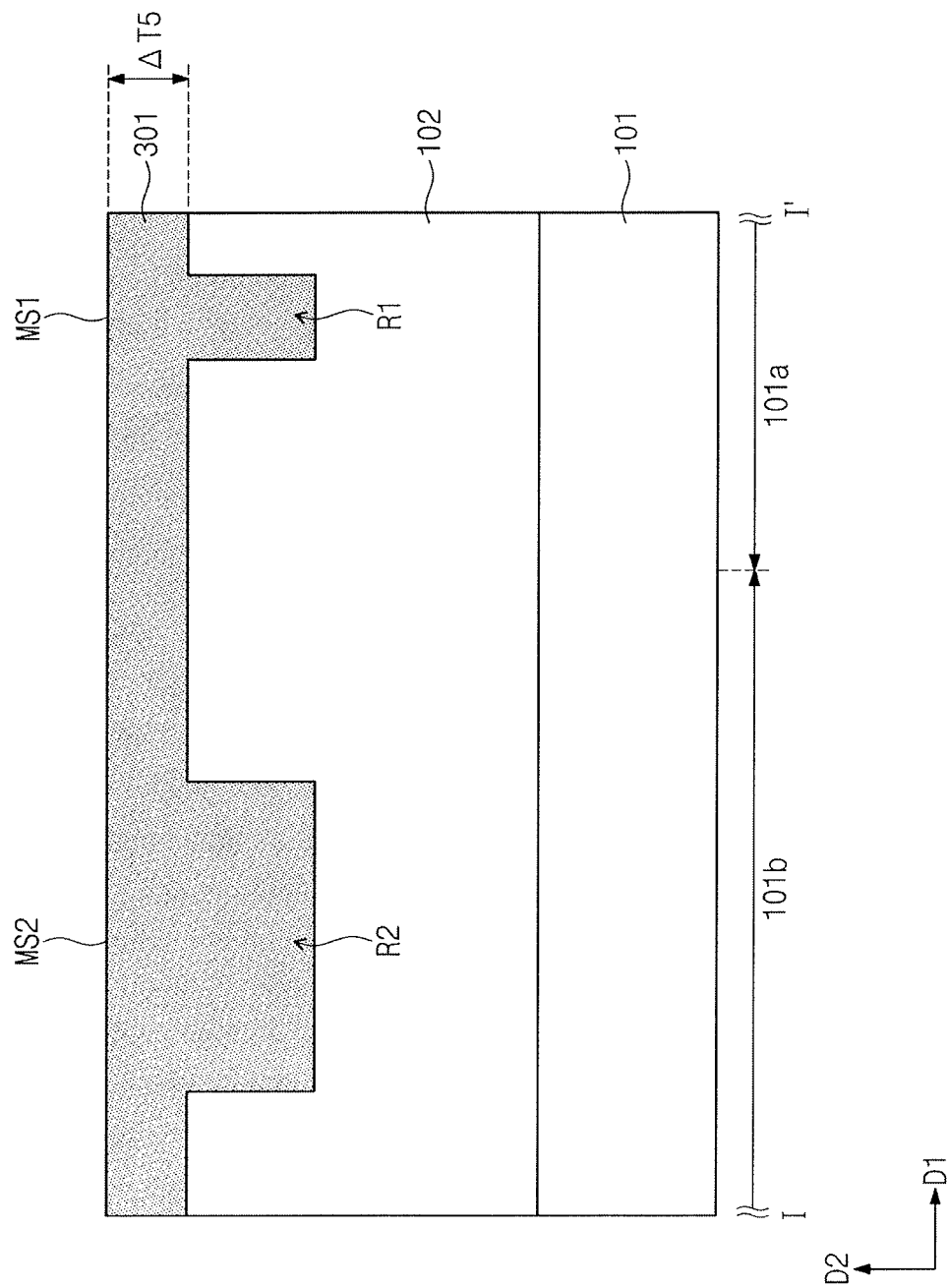

Referring to FIG. 17, a second annealing process may be performed such that the mask material solution layer 201 is cured into a mask pattern 301. The cured mask material layer 203 may be substantially the same as the mask pattern 301. For example, after the second annealing process, the mask pattern 301 and the cured mask material layer 203 may have no boundary therebetween.

The second annealing process may evaporate a solvent and a remaining fluorine additive 202 from the non-cured mask material solution layer 201. For example, the mask pattern 301 may have an average thickness ΔT5 in a second direction D2 that is less than a sum ΔT4 (see FIG. 16) of an average thickness in the second direction D2 of the mask material layer 201 and an average thickness in the second direction D2 of the cured mask material layer 203.

The mask pattern 301 on the first region 101a may have a top surface MS1 at a level substantially the same as that of a top surface MS2 of the mask pattern 301 on the second region 101b. The mask pattern 301 may have a (negligible) height difference equal to or less than about 15 nm between the level of the top surface MS1 on the first region 101a and the level of the top surface MS2 on the second region 101b.

Figure 18:
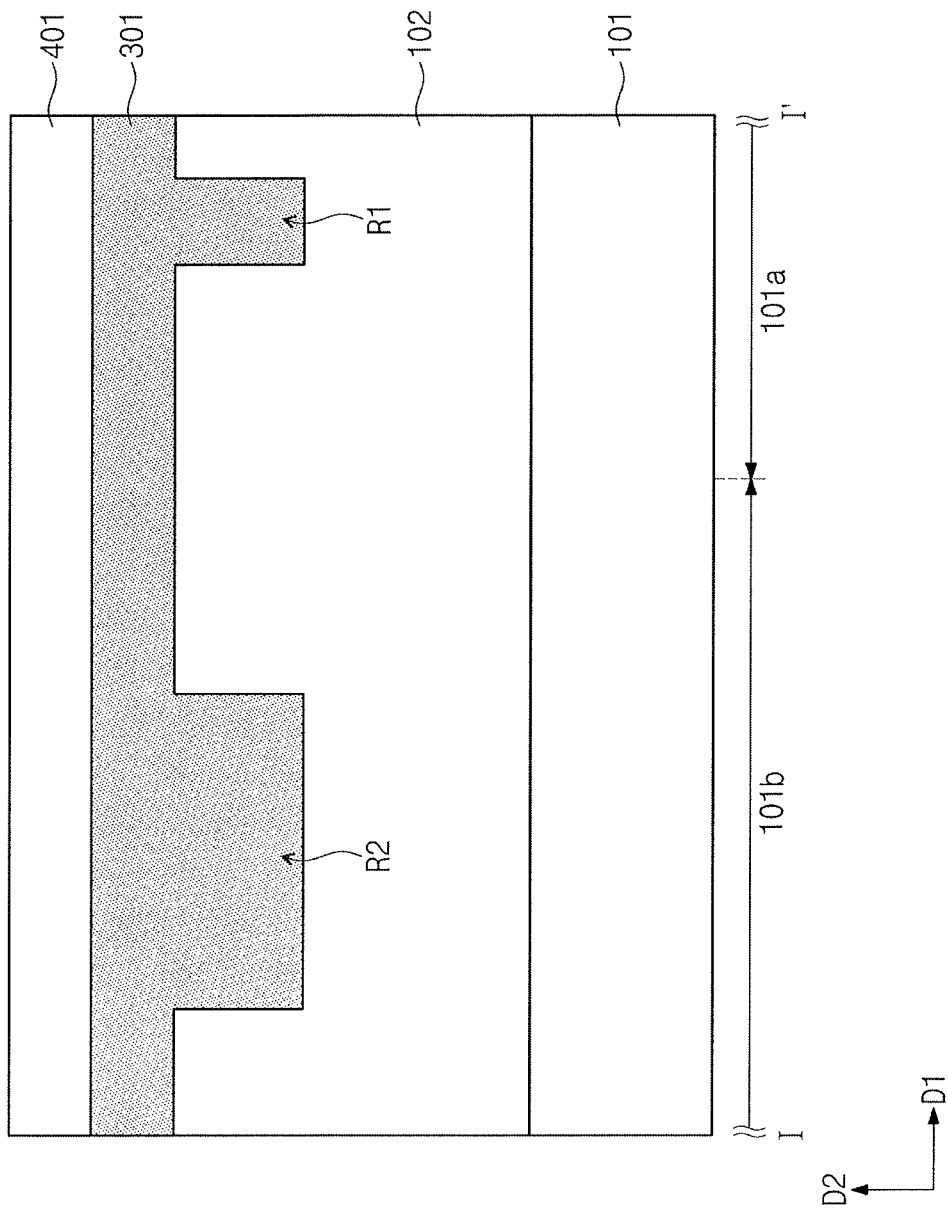

Referring to FIG. 18, an additional mask layer 401 may be formed on the mask pattern 301. The additional mask layer 401 may include, e.g., a silicon oxynitride layer.

The mask pattern 301 may have a flat top surface, and the additional mask layer 401 may be formed to have a flat top surface. In an implementation, a photoresist layer may be formed on the additional mask layer 401.

Figure 19:
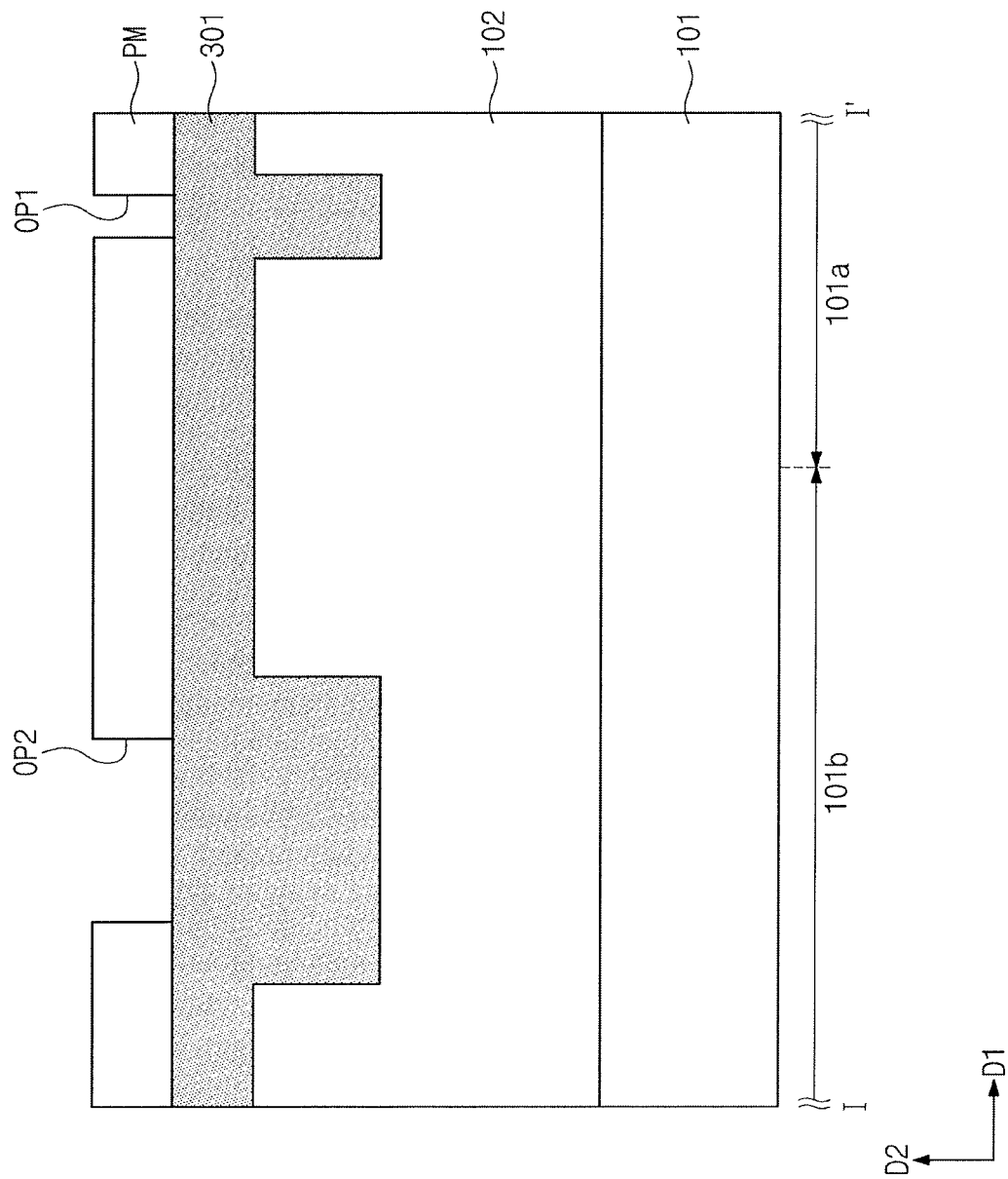

Referring to FIG. 19, exposure and development processes may be performed to convert the additional mask layer 401 into additional mask patterns PM. The additional mask patterns PM may be provided therebetween with a first opening OP1 and a second opening OP2 that partially expose a top surface of the mask pattern 301.

Figure 20:
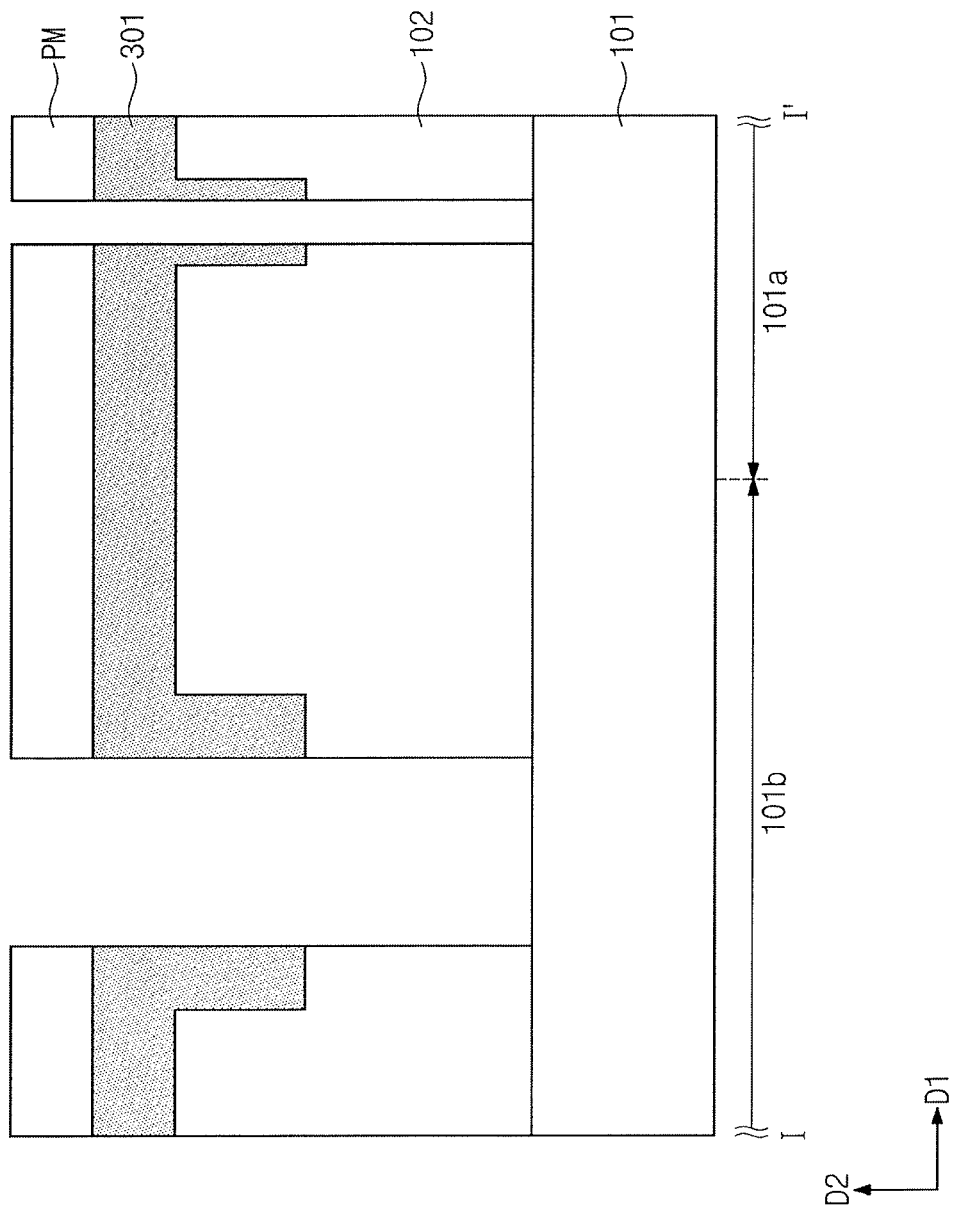

Referring to FIG. 20, the additional mask patterns PM may be used as an etching mask to etch the mask pattern 301 and the dielectric layer 102 to partially expose the top surface of the substrate 101.

Figure 21:
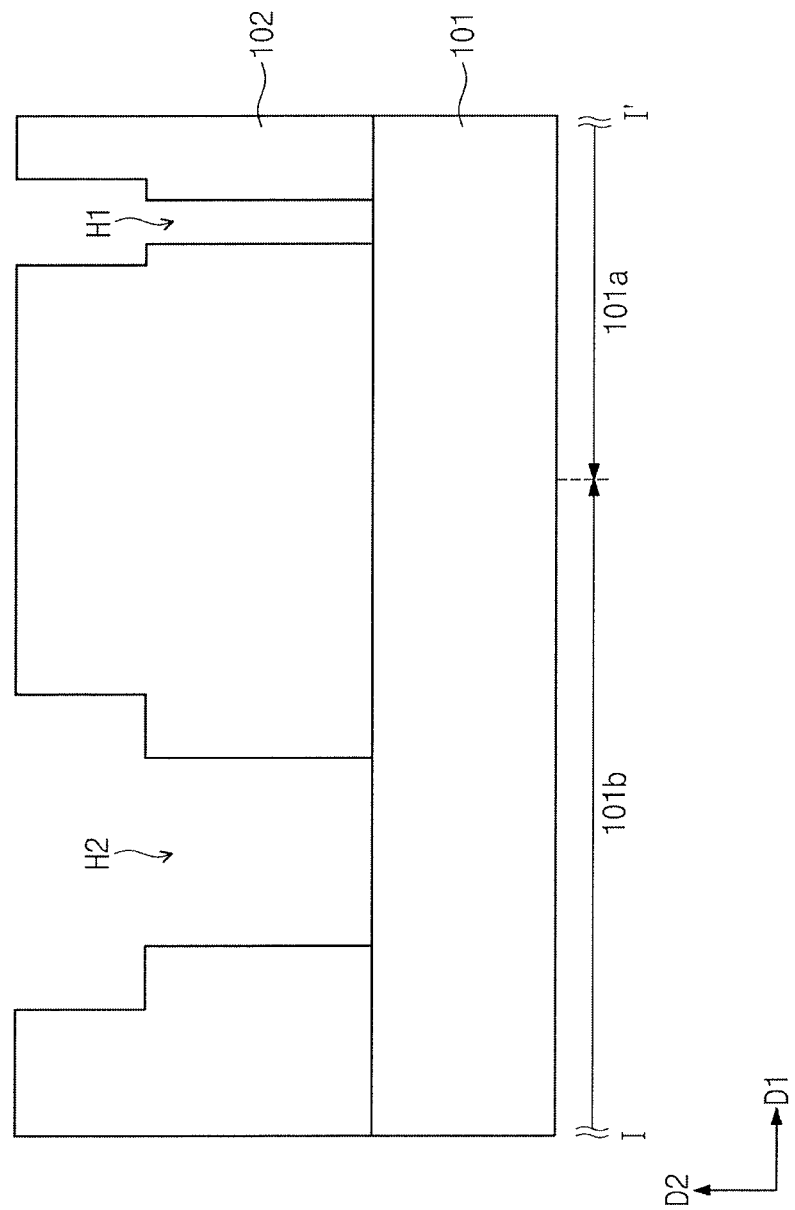

Referring to FIG. 21, the additional mask patterns PM and the mask pattern 301 may be removed to form a first hole H1 and a second hole H2.

Figure 22:
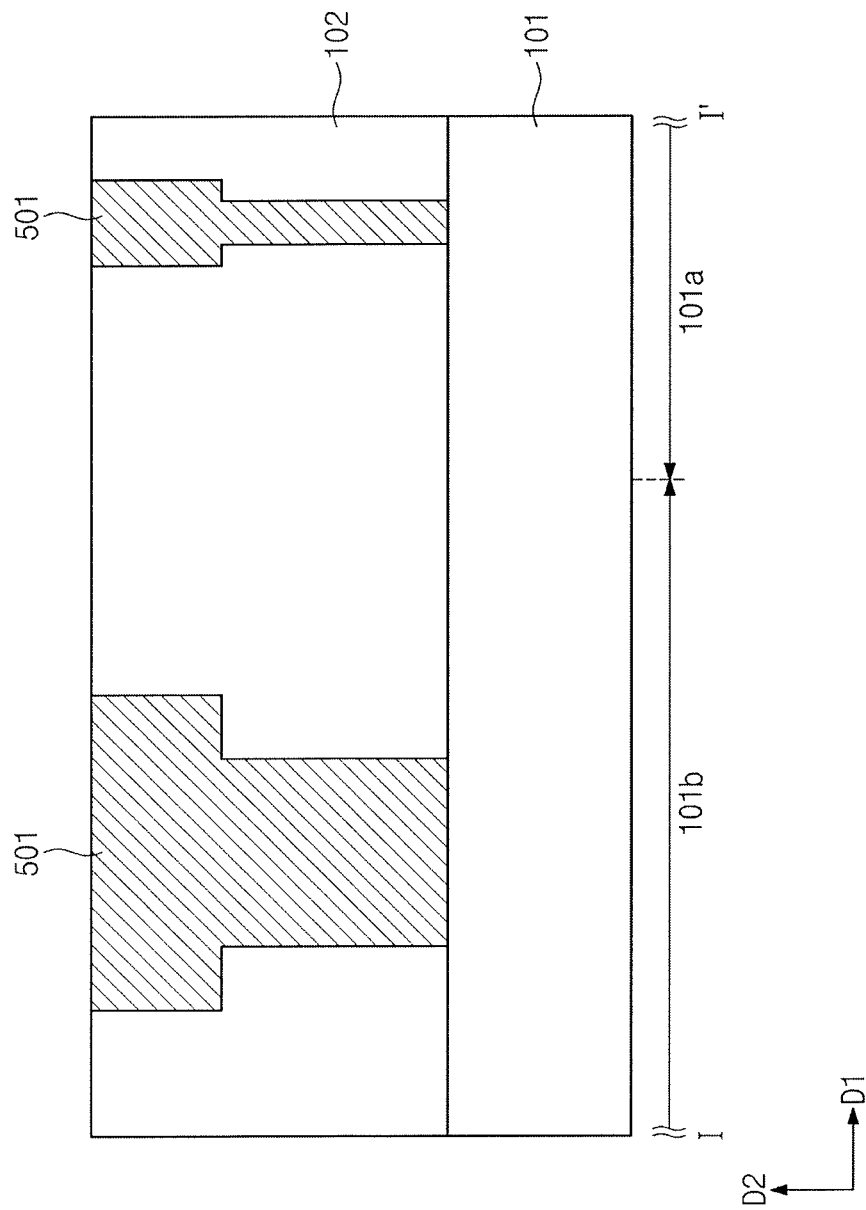

Referring to FIG. 22, the first hole H1 and the second hole 112 may be filled with a conductive material 501. The conductive material 501 may include a metallic material, e.g., copper. After the conductive material 501 is formed, the substrate 101 may undergo a planarization process, such as chemical mechanical polishing.

TABLE 1

| | | Fluorine additive ratio (wt %) | | | |
|---|---|---|---|---|---|
| | | 0 | 10 | 30 | 50 |
| Thickness of mask material layer (nm) | After first annealing process (240° C., 90 s) | 208.6 | 202.0 | 180.2 | 162.3 |
| | After rinse process | 208.3 | 186.2 | 144.4 | 102.5 |
| Difference in thickness (nm) | | 0.3 | 15.8 | 35.8 | 59.8 |
| Thickness of mask pattern after second annealing process (400° C., 90 s) | | 176.0 | 157.1 | 121.2 | 84.2 |

Figure 23:
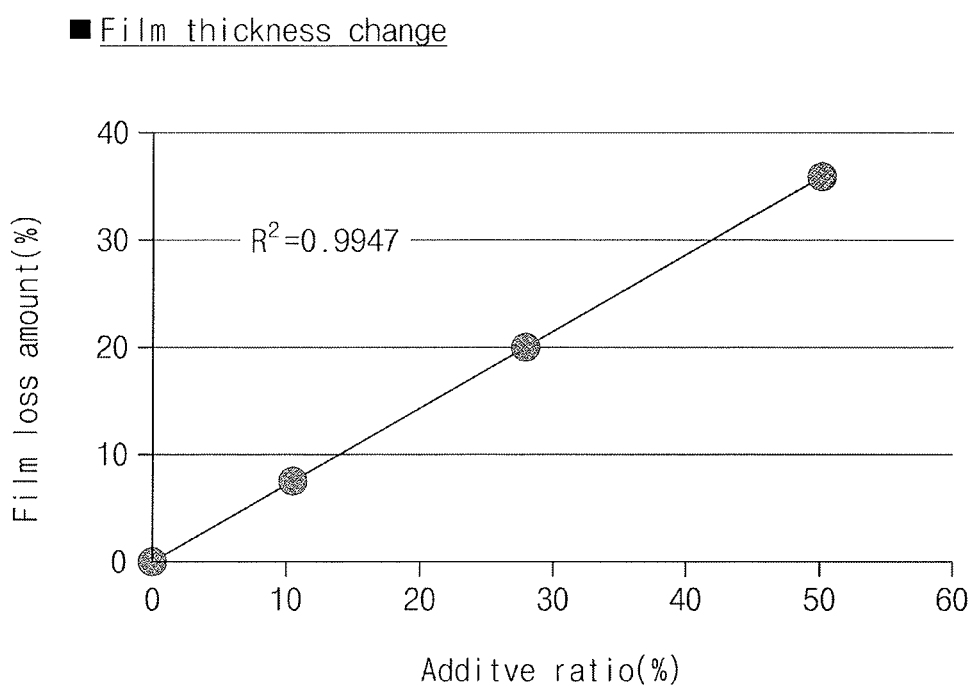
FIG. 23 illustrates a graph showing an amount of reduction in thickness of a mask material layer in accordance with a fluorine additive ratio.

Table 1 shows a variation in thickness of a mask material layer in accordance with fluorine additive ratios and process steps. FIG. 23 illustrates a graph showing an amount of reduction in thickness of a mask material layer in accordance with a fluorine additive ratio after a rinse process of Table 1.

Referring to Table 1 and FIG. 23, as the fluorine additive ratio increased in the mask material solution layer, the amount of reduction in thickness of the mask material solution layer may be increased. When the rinse process removed an upper portion of the mask material layer, the removal rate may be raised as the fluorine additive is increased.

Figure 24:
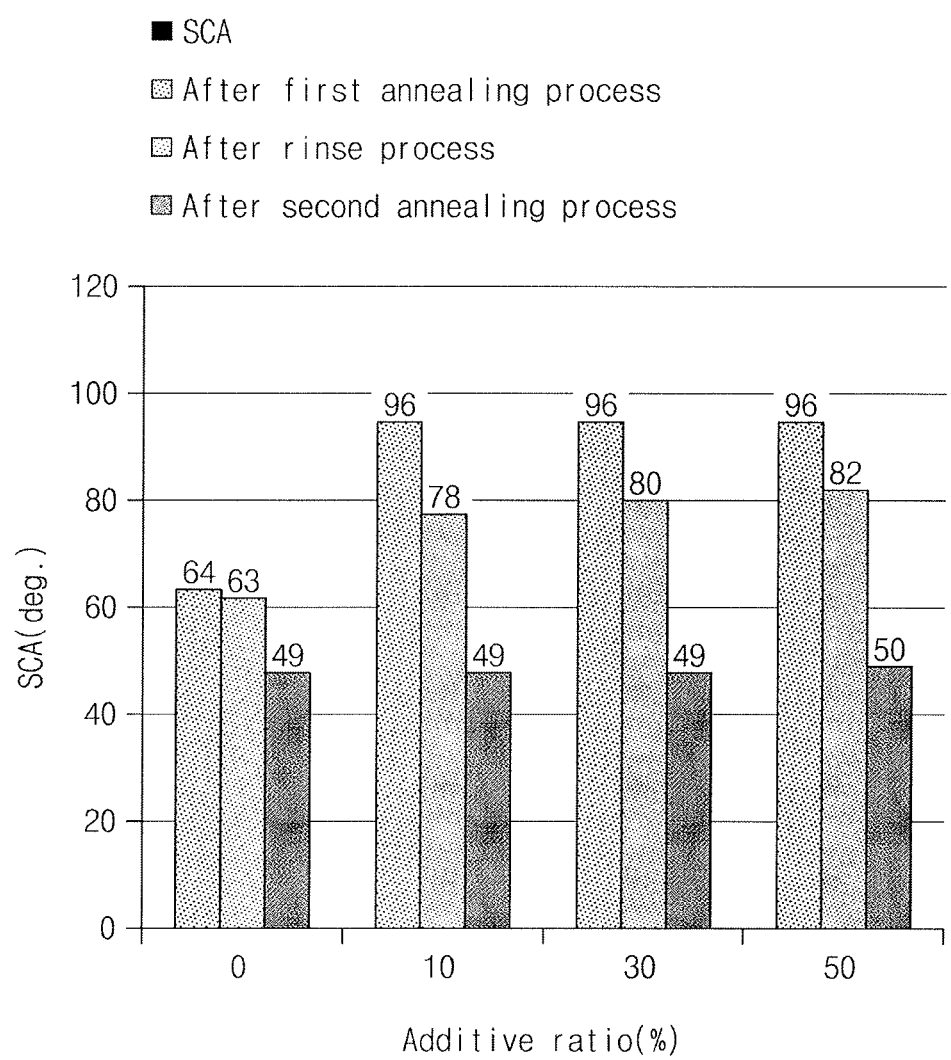
FIG. 24 illustrates a graph showing a static contact angle (SCA) of water in accordance with a fluorine additive ratio.

FIG. 24 illustrates a graph showing a static contact angle (SCA) of water in accordance with a fluorine additive ratio. The higher the static contact angle (SCA), the higher the hydrophobicity.

Referring to FIG. 24, the mask material layer may be spin-coated on a substrate, and then a first annealing process may be performed at a temperature of about 240° C. for about 90 seconds. The static contact angle (SCA) of wafer on a surface of the mask material layer may be increased when the fluorine additive ratio is 10 wt %, 30 wt %, and 50 wt %, as compared with when the fluorine additive ratio is 0 wt %. This result indicates that, after the spin coating process, a hydrophobic fluorine additive may be segregated in an upper portion of the mask material layer.

Afterwards, the static contact angle (SCA) may be reduced after the rinse process. This result indicates that the mask material layer may decrease in hydrophobicity on a surface thereof. Accordingly, the segregated fluorine additive may be partially removed.

After a second annealing process is performed at a temperature of 400° C. for 90 seconds, the static contact angle (SCA) may not change regardless of an initial amount of the fluorine additive. For example, when the mask material layer undergoes the second annealing process to form a mask pattern, substantially no fluorine additive may remain in the mask pattern.

TABLE 2

| | Thickness of mask pattern on first region (A) | Thickness of mask pattern on second region (B) | Thickness of mask pattern on third region (C) | Height difference (C − A) |
|---|---|---|---|---|
| Embodiment 1 | 198 nm | 202 nm | 209 nm | 11 nm |
| Comparative 1 | 152 nm | 164 nm | 174 nm | 22 nm |

Table 2 indicates thicknesses of the mask pattern of an Embodiment 1 in which the mask pattern is formed from the mask material layer including the fluorine additive, and thicknesses of the mask pattern of Comparative 1 in which the mask pattern is formed form the mask material layer including no fluorine additive.

In each of Embodiment 1 and Comparative 1, the first region had a pattern pitch of 90 nm, a pattern width of 45 nm, and a recess width of 45 nm. In each of Embodiment 1 and Comparative 1, the second region had a pattern pitch of 104 nm, a pattern width of 59 nm, and a recess width of 45 nm. In each of Embodiment 1 and Comparative 1, the pattern pitch may be a pixel pitch between patterns.

In Embodiment 1, the mask pattern had a thickness of 209 nm on the third region, a thickness of 198 nm on the first region, and a height difference of 11 nm between the first and third regions. In Comparative 1, the mask pattern had a thickness of 174 nm on the third region, a thickness of 152 nm on the first region, and a height difference of 22 nm between the first and third regions. It may be seen that the height difference was more reduced when using the mask material layer including the fluorine additive than when using the mask material layer including no fluorine additive.

According to an embodiment, a mask material solution layer containing a fluorine additive may be formed thick on a substrate that includes a plurality of patterns having different densities from each other, a spin coating process may be performed to separate a fluorine additive layer from the mask material solution layer, and a liquid material may be used to remove the fluorine additive layer, with the result that the mask material solution layer may remove its height difference caused by a difference in pattern density.

Hence, process steps may be reduced to accomplish economic effects, compared to an etch-back process or two-step spin-on-hardmask (SOH) process.

By way of summation and review, a high aspect ratio of patterns may result in a hardmask material layer having a non-uniform thickness and a non-flat top surface, and it could be difficult to accurately perform an exposure process.

In a method of forming a mask pattern according to an embodiment, a hardmask may reduce its height difference caused by a difference in pattern density on a substrate.

One or more embodiments may provide a method of forming a mask pattern having improved flatness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a mask pattern, the method comprising;
    providing a substrate including a plurality of patterns thereon;
    forming a mask material solution layer such that the mask material solution layer covers the patterns on the substrate; and
    applying a liquid material to remove an upper portion of the mask material solution layer,
    wherein the mask material solution layer includes a fluorine additive concentrated at the upper portion of the mask material solution layer.

2. The method as claimed in claim 1, wherein:
    the patterns include a plurality of first patterns and a plurality of second patterns,
    a width of each of the first patterns is less than a width of each of the second patterns, and
    the substrate includes a first region on which the first patterns are disposed and a second region on which the second patterns are disposed.

3. The method as claimed in claim 2, wherein top surfaces of each of the first patterns are located at a same level as top surfaces of each of the second patterns.

4. The method as claimed in claim 1, wherein the mask material solution layer includes a spin-on-hardmask material.

5. The method as claimed in claim 1, wherein forming the mask material solution layer includes performing a spin coating process to coat a mask material solution on the substrate.

6. The method as claimed in claim 5, further comprising, after performing the spin coating process, performing a first annealing process on the mask material solution layer.

7. The method as claimed in claim 1, wherein the fluorine additive includes polyvinyl fluoride, polyvinylidene fluoride, polytrifluoroethylene, polychlorotrifluoroethylene, fluorinated ethylene propylene, paraffin, polytetrafluoroethylene, or poly(hexafluoropropylene).

8. The method as claimed in claim 1, wherein an amount of the fluorine additive contained in the mask material solution layer is greater than 0 wt % and less than or equal to 80 wt %.

9. The method as claimed in claim 1, wherein the liquid material includes a thinner, an alcohol, or a developer.

10. The method as claimed in claim 1, further comprising, after removing the upper portion of the mask material solution layer, performing a second annealing process on the mask material solution layer.

11. A method of fabricating a semiconductor device, the method comprising:
    forming a plurality of recesses on a substrate;
    dispensing a mask material solution on the substrate, the mask material solution including a fluorine additive;
    dividing the dispensed mask material solution into a first layer and a second layer;
    curing at least a portion of the first layer; and
    removing the second layer,
    wherein:
    the fluorine additive is concentrated in the second layer, and
    removing the second layer includes using a solution that has an affinity to the fluorine additive.

12. The method as claimed in claim 11, wherein:
    the recesses include a plurality of first recesses and a plurality of second recesses,
    a width of each first recess of the plurality of first recesses is less than a width of each second recess of the plurality of second recesses.

13. The method as claimed in claim 12, wherein dispensing the mask material solution is performed until a top surface of the mask material solution on each first recess of the plurality of first recesses is located at a level the same as a level of a top surface of the mask material solution on each second recess of the plurality of second recesses.

14. The method as claimed in claim 11, wherein dividing the mask material solution into the first layer and the second layer includes rotating the substrate.

15. The method as claimed in claim 11, wherein curing the at least a portion of the first layer includes transferring heat from a heat source below the substrate toward a bottom surface of the substrate.

16. The method as claimed in claim 11, wherein removing the second layer includes rotating the substrate and simultaneously dispensing the solution that has an affinity to the fluorine additive.

17. The method as claimed in claim 11, wherein the solution that has an affinity to the fluorine additive includes a liquid material that dissolves the fluorine additive.

18. The method as claimed in claim 11, further comprising, after removing the second layer, performing an annealing process that completely cures the first layer.

19. The method as claimed in claim 11, further comprising, after removing the second layer:
    annealing the first layer to form a mask pattern;
    forming an additional mask layer on the mask pattern;
    patterning the additional mask layer; and using the patterned additional mask layer as an etching mask to etch the mask pattern.

20. A method of forming a mask pattern, the method comprising;
providing a substrate including a plurality of patterns thereon;
forming a mask material solution layer such that the mask material solution layer covers the patterns on the substrate; and
annealing the mask material solution layer to remove an upper portion of the mask material solution layer,
wherein the mask material solution layer includes a fluorine additive concentrated at the upper portion of the mask material solution layer, and
wherein the annealing cures mask material solution layer completely.

* * * * *